US005210487A

United States Patent [19]
Takahashi et al.

[11] Patent Number: 5,210,487
[45] Date of Patent: May 11, 1993

[54] DOUBLE-GATED INTEGRATING SCHEME FOR ELECTRON BEAM TESTER

[75] Inventors: Hitoshi Takahashi, Tokyo, Japan; Douglas Masnaghetti, San Jose; Neil Richardson, Palo Alto, both of Calif.

[73] Assignee: Schlumberger Technologies Inc., Los Altos, Calif.

[21] Appl. No.: 710,768

[22] Filed: Jun. 4, 1991

[51] Int. Cl.$^5$ .................... G01R 31/00; G01R 31/02
[52] U.S. Cl. ........................ 324/158 R; 324/71.3; 250/207; 250/307
[58] Field of Search ............... 324/158 R, 158 D, 713; 250/310, 311, 307, 397, 207

[56] References Cited

U.S. PATENT DOCUMENTS

| | | |
|---|---|---|
| 3,535,516 | 10/1970 | Munakata . |
| 3,628,012 | 12/1971 | Plows et al. . |
| 3,796,947 | 3/1974 | Harrod et al. . |
| 4,220,854 | 9/1980 | Feuerbaum ............... 324/158 R |
| 4,358,732 | 11/1982 | Johnston et al. . |
| 4,387,304 | 6/1983 | Younkin ................... 324/158 R |
| 4,477,775 | 10/1984 | Fazekas .................... 324/158 R |
| 4,486,660 | 12/1984 | Feuerbaum . |
| 4,581,534 | 4/1986 | Todokoro et al. ......... 250/310 |
| 4,623,836 | 11/1986 | Frosien et al. ........... 324/158 R |
| 4,629,889 | 12/1986 | Todokoro et al. ......... 250/310 |
| 4,706,019 | 11/1987 | Richardson . |
| 4,721,855 | 1/1988 | Fazekas . |
| 4,721,909 | 1/1988 | Richardson . |
| 4,755,749 | 7/1988 | Ookubo et al. ........... 324/158 R |
| 4,851,768 | 7/1989 | Yoshizawa ................ 324/158 R |
| 4,967,152 | 10/1990 | Patterson ................. 324/158 R |
| 4,972,142 | 11/1990 | Brust ....................... 324/158 R |
| 4,985,628 | 1/1991 | Horstman ................. 250/311 |

FOREIGN PATENT DOCUMENTS

| | | |
|---|---|---|
| 0135869 | 4/1985 | European Pat. Off. . |
| 0225969 | 6/1987 | European Pat. Off. . |
| 0266535 | 5/1988 | European Pat. Off. . |

OTHER PUBLICATIONS

J. Abernethy, The Boxcar Detector, Wireless World, Dec. 1970, four pages.
M. Badea et al., Versatile nanosecond fluorometer employing a boxcar averager, Rev. Sci. Instrum., vol. 47, No. 3, Mar. 1976, pp. 314-317.
S. Blacker, A digital trigger delay unit for use in variable-path-length ultrasonic measurements, Dec. 1976, pp. 1047-1049.
G. Bolle et al., Digital Time Base, Alta Frequenza vol. 46, No. 3, Dec. 1977, pp. 157-160 (English-language abstract only).

(List continued on next page.)

Primary Examiner—Ernest F. Karlsen
Assistant Examiner—William J. Burns
Attorney, Agent, or Firm—Kenneth Olsen; Keith G. W. Smith; Bruce D. Riter

[57] ABSTRACT

A surface is probed with a pulsed electron beam and secondary electrons are detected to produce a detector signal. First portions of the detector signal are substantially dependent on the voltage of the surface being probed, while second portions of the detector signal are substantially independent of the voltage of the surface being probed. In general, the first and second portions of the detector signal include unwanted noise caused by low-level sampling due to beam leakage and/or by scintillator afterglow in the secondary-electron detector. The detector signal is sampled during the first signal portions and is sampled during the second signal portions. The sampled first signal portions are combined with the complement of the sampled second signal portions to produce a measured voltage signal representing voltage of the conductor. In a preferred sampling scheme, alternate electron-beam sampling pulses are held-off. A first gate samples the secondary-electron detector signal when sampling pulses are not held off. A second gate samples the secondary-electron detector signal when sampling pulses are held off, and these samples are inverted. The samples from the first gate are combined with the inverted samples from the second gate to substantially cancel unwanted background noise caused by beam leakage and/or scintillator afterglow after sufficient integration.

16 Claims, 14 Drawing Sheets

OTHER PUBLICATIONS

F. Castelli et al., Optical integration of the exciting laser pulse and ratio circuit for fast emission measurements, Rev. Sci. Instrum., vol. 47, No. 4, Apr. 1976, pp. 509–512.

W. Cooke et al., Boxcar controller for low-repetition-rate use, Rev. Sci. Instrum. 50(11), Nov. 1979, pp. 1490–1492.

P. Fazekas et al., On-Wafer Defect Classification of LSI-Circuits using a Modified SEM, Scanning Electron Microscopy, vol. 1, Dec. 1978, pp. 754 and 801–806.

H. Feuerbaum et al., Beam chopper for subnanosecond pulses in scanning electron microscopy, J. Phys. E: Sci. Instrum., vol. 11, Dec. 1978, pp. 529–532.

H. Feuberbaum et al., Signal Processing for E-Beam Waveform Measurements, Int'l. Conf. on Microlithography, Microcircuit Engineering 81, Lausanne, Switzerland, Sep. 28–30, 1981, seven pages.

H. Feuerbaum et al., Improved Secondary Electron Signal Processing for Waveform Measurements, Scanning Electron Microscopy, vol. IV, Dec. 1982, pp. 1501–1505.

A. Gopinath et al., Some Aspects of the Stroboscopic Mode: A Review, Scanning Electron Microscopy, vol. I, Dec. 1974, pp. 235–242.

T. Hosokawa et al., Gigahertz stroboscopy with the scanning electron microscope, Rev. Sci. Instrum., 49(9), Sep. 1978, pp. 1293–1299.

D. Keefe et al., Automatically sweeping dual-channel boxcar integrator, Rev. Sci. Instrum., 49(10), Oct. 1978, pp. 1388–1391.

K. Kosai, External generation of gate delays in a boxcar integrator-Application to deep level transient spectroscopy, Rev. Sci. Instrum., 53(2), Feb. 1982, pp. 210–213.

P. Lawless et al., Baseline corrector for boxcar integrator instruments and its application to plasma chromatography, Rev. Sci. Instrum. vol. 48, No. 3, Mar. 1977, pp. 240–244.

M. Masuda et al., Study of two-dimensional Gunn domain dynamics using a stroboscopic SEM, Appl. Phys. Lett., 33(10), Nov. 15 1978, pp. 888–889.

P. Palmer et al., Signal averaging with a magnetic tape loop and boxcar integrator, J. Phys. E: Sci. Instrum., vol. 9, Dec. 1976, pp. 783–786.

G. Plows et al., Dynamic Voltage Contrast Display using the Stroboscopic Scanning Electron Microscope, Abstract No. 154 (undated), one page.

G. Plows et al., Stroboscopic scanning electron microscopy, J. Phys. E: Sci. Instrum., Dec. 1968, Series 2, vol. 1, pp. 595–600.

G. Plows et al., Operational testing of L.S.I. Arrays by Stroboscopic Scanning Electron Microscopy, Microelectronics and Reliability, Dec. 1971, vol. 10, pp. 317–323.

Model 162 Boxcar Integrator, Operating and Service Manual, Princeton Applied Research Corporation, Dec. 1976.

Model 162 Boxcar Averager System, Including Model 115 Wideband Preamplifier, EG&G Princeton Applied Research, Dec. 1980.

P. Reddy et al., Digital double boxcar integrator for pulsed NMR experiments, IEEE Proc., vol. 129, Pt. G, No. 5, Oct. 1982, pp. 245–249.

R. Srinivasan et al., A programmable digital signal averager, J. Phys. E: Sci. Instrum., vol. 13, Dec. 1980, pp. 1263–1265.

D. Swain, Boxcar Integrator Attachment for Oscilloscopes, Rev. Sci. Instrum., vol. 41, No. 4, Apr. 1970, pp. 545–547.

D. Taylor et al., Microcomputer controlled boxcar integrator with subnanosecond rise time, Rev. Sci. Instrum. 51(6), Jun. 1980, p. 855.

K. Lindsay, The Boxcar Integrator, Sampling Oscilloscope Application Note #44L1.0, Tektronix, Inc., May 14, 1974.

E. Wolfgang et al., Electron-Beam Testing of VLSI Circuits, IEEE J. Solid-State Circuits, vol. SC-14, No. 2, Apr. 1979, pp. 471–489.

DOUBLE-GATED INTEGRATING SCHEME FOR ELECTRON BEAM TESTER

BACKGROUND OF THE INVENTION

1. Field of the Invention

The present invention relates to electron beam testers, and particularly to electron beam testers used in probing of integrated circuits.

2. The Prior Art

Electron-beam test systems for probing, scanning and diagnosing VLSI (very large scale integrated) circuit devices are known in the art. See, for example, U.S. Pat. No. 4,706,019 to Neil Richardson, which is incorporated herein by this reference. FIG. 1 is a schematic block view of such a system 110, comprising a test probe 112, a circuit exerciser 114, a data processing system (DPS) 116, and a display terminal 118. Test probe 112 and circuit exerciser 114 are controlled by data processing system 116 in response to commands entered by an operator, while a circuit device under test (DUT) mounted within test probe 112 is exercised by signals from exerciser 114. Electron-beam test systems of this type are commercially available, such as the IDS 5000 system offered by the Diagnostic Systems Division of Schlumberger Technologies, Inc., San Jose, Calif.

FIG. 2 is a functional block diagram of portions of a typical prior-art system of the kind shown in FIG. 1, as configured for voltage measurement. Circuit exerciser 114 applies a repetitive pattern of signals to exercise the DUT, and sends timing signals to a timebase circuit 210 within test probe 112. Timebase circuit 210 controls a beam pulser 215 which supplies a train of control pulses to a beam blanker 220. In response to the control pulses from beam pulser 215, beam blanker 220 periodically unblanks a beam of electrons produced by an electron source 225. The resulting train of electron-beam pulses 235 is finely-focused in an electron optical column 230. Electron-beam pulses 235 are directed at a conductor of interest inside the DUT.

Voltage measurement is achieved by detecting and analyzing the energies of secondary electrons 240 which are generated during interaction of the electron-beam pulses 235 with the DUT. An electron detector 245 comprising a scintillator 247 and a photomultiplier 249 detects the secondary electrons 240, and provides a detector output signal. The detector output signal is passed through a buffer 250 to a gate switch 255. The closing of gate switch 255 is controlled by signals from a gate pulser 260. Gate pulser 260 is in turn responsive to control signals from timebase 210 which are synchronized with the control signals to beam pulser 215. Closing of gate switch 255 causes the buffered detector output signal to be sampled. The samples are supplied to an integrator circuit 260.

The measured voltage output from integrator circuit 260 is added to an offset voltage $V_{Offset}$ in a summer 265, and the result is passed via a controllable switch 270 to a buffer 275. A filter voltage $V_{Filter}$ is supplied by buffer 275 to a secondary-electron retarding grid 280. Offset voltage $V_{Offset}$ sets the operating point of retarding grid 280. Switch 270 is operated by a scan generator 285 which also controls the beam deflection coils (not illustrated) within electron-optical column 230. During waveform (voltage) measurement, scan generator 285 produces a waveform-mode signal which maintains switch 270 in the "W" position (as illustrated), and supplies a beam-vectoring signal to the beam deflection coils to direct the electron-beam at a conductor of the DUT to be probed.

Samples may be taken once for each repetition of the test pattern applied to the DUT by circuit exerciser 114, although typically the samples are taken at multiple sampling intervals during the test pattern repetition. Integrator circuit 260 integrates the samples from a number of repetitions of the test pattern applied to the DUT to produce a voltage measurement signal at its output. It is noted that the integrator circuit 260 is shown only schematically for simplicity of illustration. If samples are taken during multiple sampling intervals of the test pattern, the samples are integrated interval-by-interval. That is, the samples from the first interval of multiple repetitions of the test pattern are integrated to produce a voltage measurement for the first interval, the samples from the second interval of multiple repetitions of the test pattern are integrated to produce a voltage measurement for the second interval, and so on. The voltage measurements for the multiple sampling intervals are typically displayed and/or recorded as a measured waveform.

High-bandwidth measurements within the DUT can thus be made by using the pulsed electron beam as a sampling probe, much like a sampling oscilloscope. The measurement bandwidth can be significantly greater than the bandwidth of the electron detector, so that the bandwidth of the electron detector is of little or no importance in determining the overall measurement bandwidth.

The measured waveform is determined by the convolution of the sampling pulse shape and the actual waveform on the conductor of the DUT being probed, as will now be explained with reference to FIG. 3. Line 310 shows an ideal electron-beam sampling pulse 312 having zero amplitude except for an infinitesimal duration at which it has a fixed, non-zero amplitude. In other words, the ideal sampling pulse is the well-known Dirac delta function, in which $\delta(t)=0$ for $t \neq 0$; $\delta(t) \neq 0$ for $t=0$; and $$\int_{-\infty}^{+\infty} \delta(t)dt = 1.$$

In practice, ideal sampling is not achievable. As shown in line 320 of FIG. 3, a practical sampling pulse 322 has a finite duration $\Delta t$, which limits the measurement rise-time. Also, the sampling pulse signal never truly achieves a zero amplitude. Forward scattering of electrons from the beam blanker (beam leakage) causes the sampling signal to have a background amplitude A as shown in line 320. These forward-scattered electrons find their way to the DUT and perform an unwanted, low-level sampling function. When the secondary-electron signal from electron detector 245 (FIG. 2) is sampled by sampling gate 255 (FIG. 2) as represented by the gate function 332 at line 330 of FIG. 3, the resultant sampling function 342 is as shown in line 340 of FIG. 3. It will be seen in line 340 that the resultant sampling function 342 includes not only the beam pulse of interest, but also an unwanted component of background noise of level $A_1$ due in large part to interaction of forward-scattered electrons with the DUT.

The source of the unwanted, forward-scattered (beam leakage) is explained with reference to FIG. 4. In conventional electron-beam testers, the beam is blanked using some kind of beam deflection apparatus and a beam limiting aperture before and after the deflection apparatus. See, for example, U.S. Pat. No. 4,721,909 to Neil Richardson, which is incorporated herein by this reference. Electrons from source 225 are directed toward a first beam-limiting aperture 410. The portion of the electron-beam which passes through aperture 410 is, if not deflected away from aperture 420 as illustrated in FIG. 4, directed at a second aperture 420 which serves as an optical entrance pupil to electron optical column 230 of FIG. 2. Deflection of the electron beam away from aperture 420 as illustrated in FIG. 4 is accomplished by charging deflection plates 425 and 430 with respective deflection voltages $-V$ and $-V$. However, even when the electron beam is supposed to be blanked, there is always a small amount of forward scattering of electrons (shown at 435) from the first aperture 410.

The typical signal processing electronics shown in FIG. 2 employs a "boxcar integrator" (e.g., gate 255 and integrator 260) which gates the electron-detector signal to remove the contribution from scattered electrons except during the "gate-open" time. The "gate-open" time is the interval during which gate switch 255 is closed to allow the electron-detector signal to pass to integrator 260. The gate-open time can be kept to a few nanoseconds if a very high bandwidth electron detector is used and if the secondary electrons are accelerated after they are emitted from the DUT so that transit-time spread through the electron detector is minimized. However, it is often preferred to use a more robust electron detector such as a scintillator, which has a lower bandwidth and a response time of about 100 nanoseconds. The scintillator's slower response time necessitates a gate-open time on the order of a few hundreds of nanoseconds. In this case, the contribution of the forward-scattered electrons to the detector-signal sample is not negligible.

For example, if the nominal sampling pulse is 100 picoseconds, the gate-open time (gate width) is 300 nanoseconds, and the beam extinction factor is 1/3000 (e.g., pulse width =1 nanosecond, gate width =300 nanoseconds), there will be equal contribution from the forward-scattered electrons and the nominal sampling pulse. This gives rise to errors in the measured waveform which can be misleading to an unsuspecting operator, as illustrated in lines 510–530 of FIGS. 5. Line 510 shows an ideal step function to be measured, having a step at 512 of 5.0 volts.

Line 520 shows a practical sampling function 522 in which the unwanted contribution 524 from forward-scattered electrons (from level 0 to level A) is about equal to the contribution 526 from the nominal sampling pulse. Convolving the sampling function of line 520 with the step function of line 510 produces a resulting measured waveform 532 as shown in line 530. Ideally, one would require that the extinction ratio be nearer 1/300,000, but this is well beyond what is typically achieved.

Multiplexed operation

An electron-beam tester offers the ability to acquire waveforms by applying the pulsed beam to a conductor within the DUT, as discussed above (waveform acquisition). Alternatively, the electron beam can be scanned over the DUT to obtain a voltage-contrast image of the device (image acquisition). Referring again to the functional block diagram of FIG. 2, scan generator 285 places switch 270 in the "I" position to disable the secondary-electron retarding grid 280 during image acquisition. Scan generator 285 also controls the deflection coils (not illustrated) of electron-optical column 230 to cause the electron beam to be raster scanned over a region of the DUT. The beam is continuously unblanked during image acquisition.

It has been found useful to multiplex between image acquisition and waveform acquisition in an electron-beam tester, for example by "stealing" alternate 30 ms video frames from image acquisition to perform waveform acquisition. That is, the electron beam is rastered over a full video frame for 30 milliseconds for image acquisition, then vectored to a point of interest for the next 30 milliseconds for waveform acquisition, and so on.

A problem encountered with multiplex operation arises from long-lifetime phosphorescence, or afterglow, in the scintillator of the electron detector. The afterglow may be on the order of many milliseconds. The "image acquisition" mode of operation generates a strong secondary electron signal for the duration of one video frame (i.e., 30 ms) which pumps up the phosphorescent states in the scintillator. This gives rise to an unwanted, background noise which decays slowly during the succeeding frame used for waveform acquisition. The problem is illustrated in lines 610–630 of FIG. 6.

As shown in line 610, the beam is unblanked full-time during image acquisition periods such as periods 612 and 616, and is unblanked periodically during alternate waveform acquisition periods such as period 614. As shown in line 620, the electron-detector output signal is essentially continuous (like a video signal) during periods of image acquisition such as periods 612 and 616. During periods of waveform acquisition (such as period 614), the electron-detector output signal contains "spikes" (e.g., "spike" 622) which result from detection of secondary electrons emitted from the DUT. However, the electron-detector output signal also includes a slowly-decaying component 624 caused by the scintillator afterglow. (Distortion due to beam leakage is not illustrated in FIG. 6, but is typically present as well.) It will be recalled that the electron detector signal is sampled during each waveform-acquisition period by gating. Line 630 shows a plurality of "gate-open" windows during waveform-acquisition period 614, one such "gate-open" window being labeled 632. The electron-detector signal is sampled during each such "gate-open" window. When samples of the electron-detector signal are integrated, the resulting "measured" waveform is distorted due to the unwanted scintillator-afterglow component of the samples. The distortion is especially noticeable when very short sampling pulses are used for waveform measurement and the electron detector is operated at high gain in waveform acquisition mode.

The simplex waveform acquisition described above with reference to FIGS. 2–5 and the waveform acquisition portion of multiplexed operation described above with reference to FIG. 6 commonly employ a sampling scheme which is illustrated schematically in lines 710–740 of FIG. 7. Line 710 shows a sequence of electron-beam pulses 712, 714, 716, 718, etc., which are applied to a DUT over time. At some time after each of electron-beam pulses 712–718 is applied to the DUT, a corresponding one of secondary-electron "spikes" 722, 724, 726, 728, etc., appears in the electron-detector output signal as shown in line 720. The electron-detector output signal is sampled during gate-function "windows" 732, 734, 736, 738, etc., as shown in line 730. The gate-function "windows" are timed so as to include the secondary-electron "spikes" of the electron-detector output signal. Line 740 of FIG. 7 shows the resulting sequence of samples 742, 744, 746, 748, etc. Each sample includes a significant contribution of unwanted background noise.

It is noted that lines 710–740 are not drawn to scale in order to better illustrate the sampling scheme. As discussed above, a nominal sampling pulse (e.g., 712) may be on the order of a few ps duration and the gate-open time of the gate-function "windows" may be on the order of 300 ns duration, while the repetition period of the gate-function "windows" is typically on the order of 1 $\mu$s to 1 ms.

The gate function "windows" (e.g., 732) may overlap the electron-beam pulses (e.g., 712) time-wise as illustrated, or may be delayed and shortened while still overlapping the "spikes" of the electron-detector signal. If the gate-function "windows" are so delayed and shortened, some improvement in signal-to-noise ratio may be realized by reducing the unwanted contribution of the forward-scattered electrons. Schemes for delaying the gate-function "windows" are discussed, for example, in U.S. Pat. No. 3,796,947 to Harrod et al. and U.S. Pat. No. 4,486,660 to Feuerbaum. However, these schemes offer only limited relief from the unwanted contribution of forward-scattered electrons, and they do little to ameliorate the unwanted noise component due to scintillator afterglow during the waveform acquisition part of multiplexed image/waveform operation.

SUMMARY OF THE INVENTION

It is an object of the present invention to provide methods and apparatus for compensating noise in an electron-beam test probe system.

In accordance with preferred embodiments of the invention, a surface is probed with a pulsed electron beam and secondary electrons are detected to produce a detector signal. First portions of the detector signal are substantially dependent on the voltage of the surface being probed, while second portions of the detector signal are substantially independent of the voltage of the surface being probed. In general, the first and second portions of the detector signal include unwanted noise caused by low-level sampling due to beam leakage and/or by scintillator afterglow in the secondary-electron detector. The detector signal is sampled during the first signal portions and is sampled during the second signal portions. The sampled first signal portions are combined with the complement of the sampled second signal portions to produce a measured voltage signal representing voltage of the conductor.

In a preferred sampling scheme, alternate electron-beam sampling pulses are held-off. A first gate samples the secondary-electron detector signal when sampling pulses are not held off. A second gate samples the secondary-electron detector signal when sampling pulses are held off, and these samples are inverted. The samples from the first gate are combined with the inverted samples from the second gate to substantially cancel unwanted background noise caused by beam leakage and/or scintillator afterglow after sufficient integration.

BRIEF DESCRIPTION OF THE DRAWING

Preferred embodiments of the present invention are described in detail below with reference to the accompanying drawing, in which.

DETAILED DESCRIPTION OF THE PREFERRED EMBODIMENTS

Figure 1:
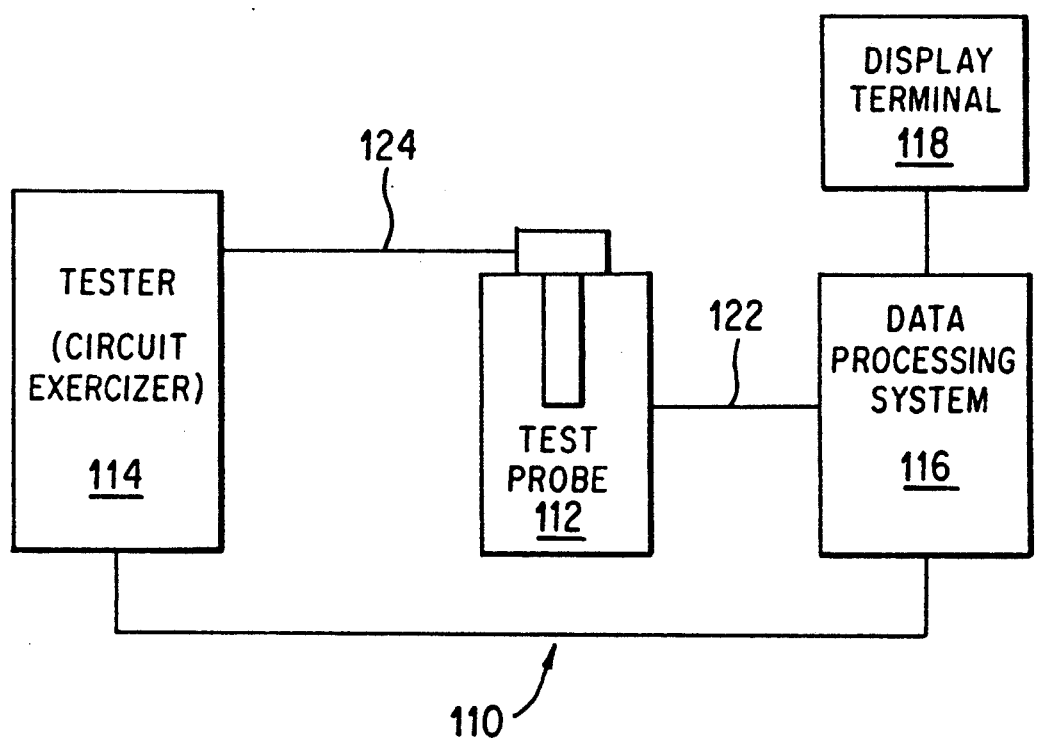
FIG. 1 is a block diagram of a prior art electron-beam test probe system.
Figure 2:
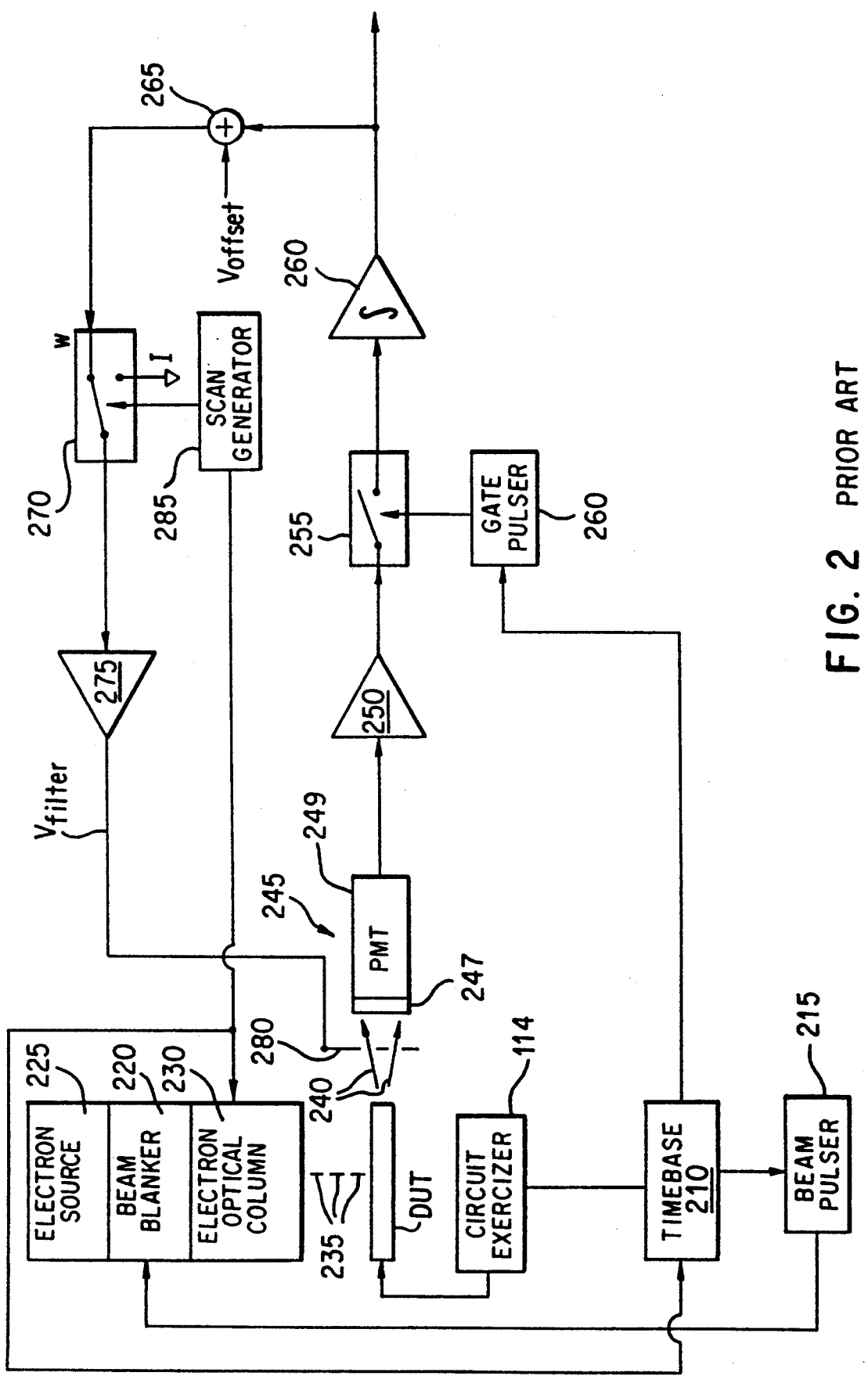
FIG. 2 is a functional block diagram of portions of an electron-beam test probe system configured in prior art fashion for waveform acquisition.
Figure 3:
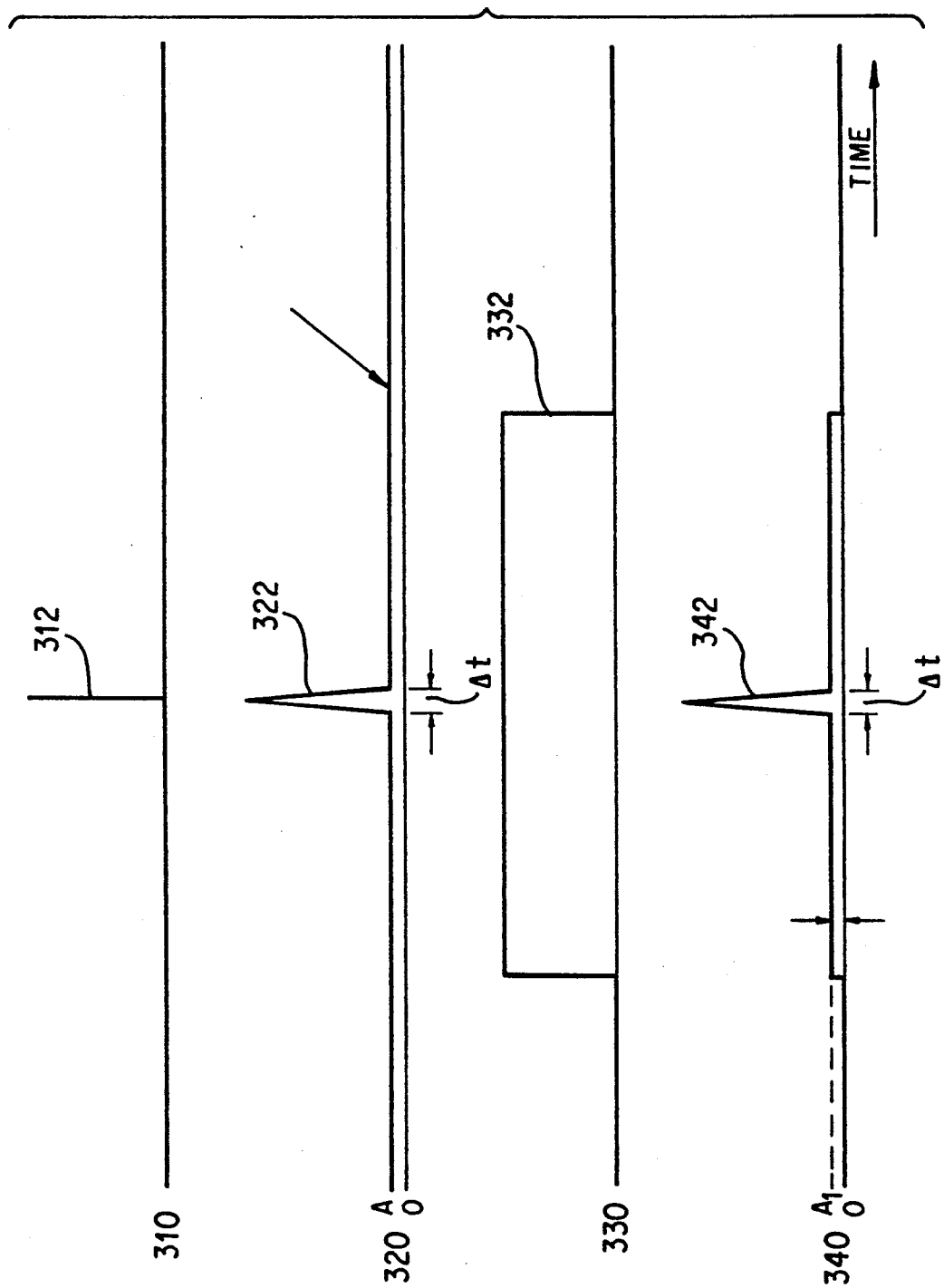
FIG. 3 illustrates a prior-art problem of unwanted noise in sampling a secondary-electron detector signal.
Figure 4:
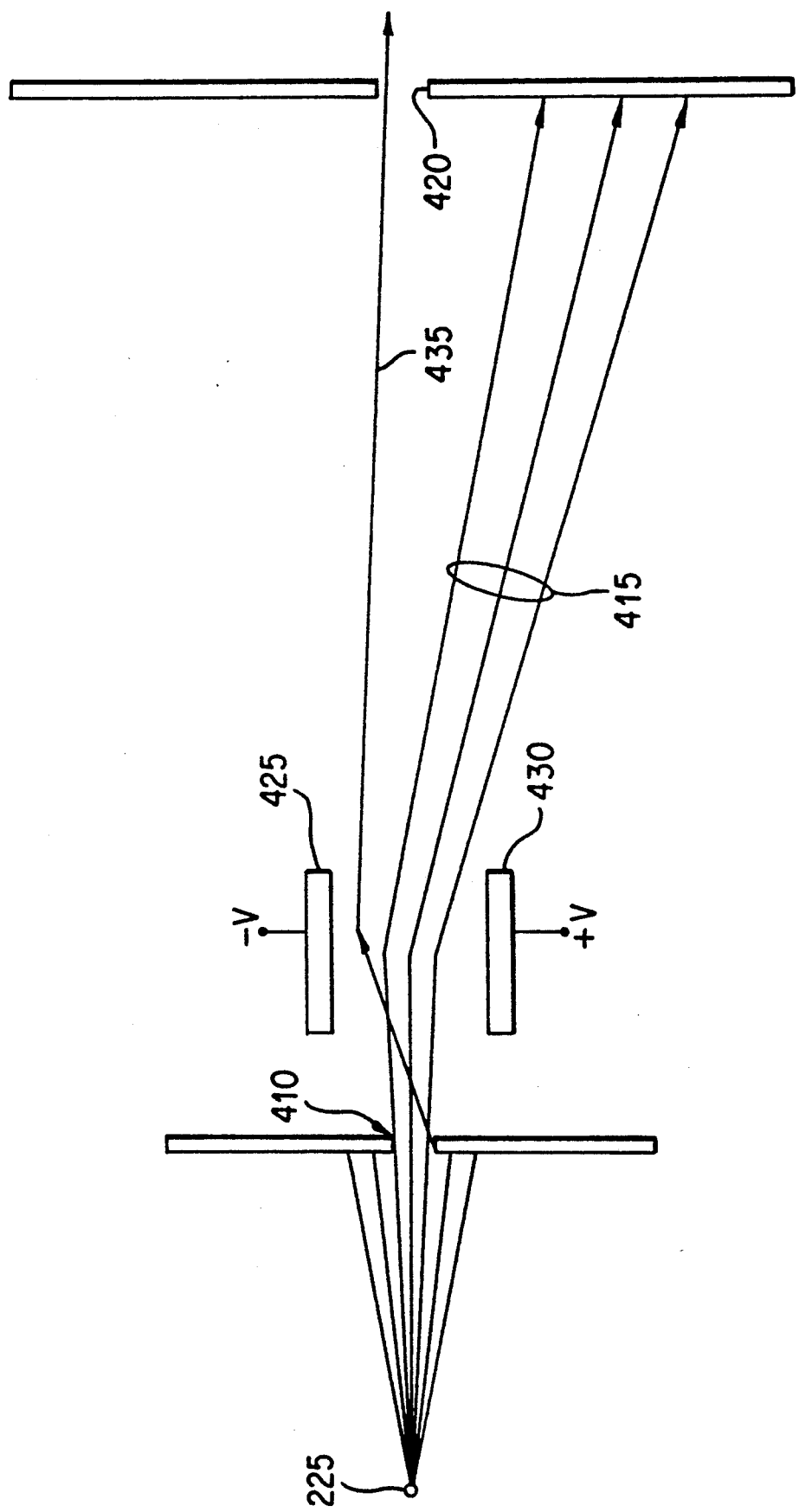
FIG. 4 illustrates the operation of a prior art electron-beam blanker having a low level of forward-scattered electrons.
Figure 5:
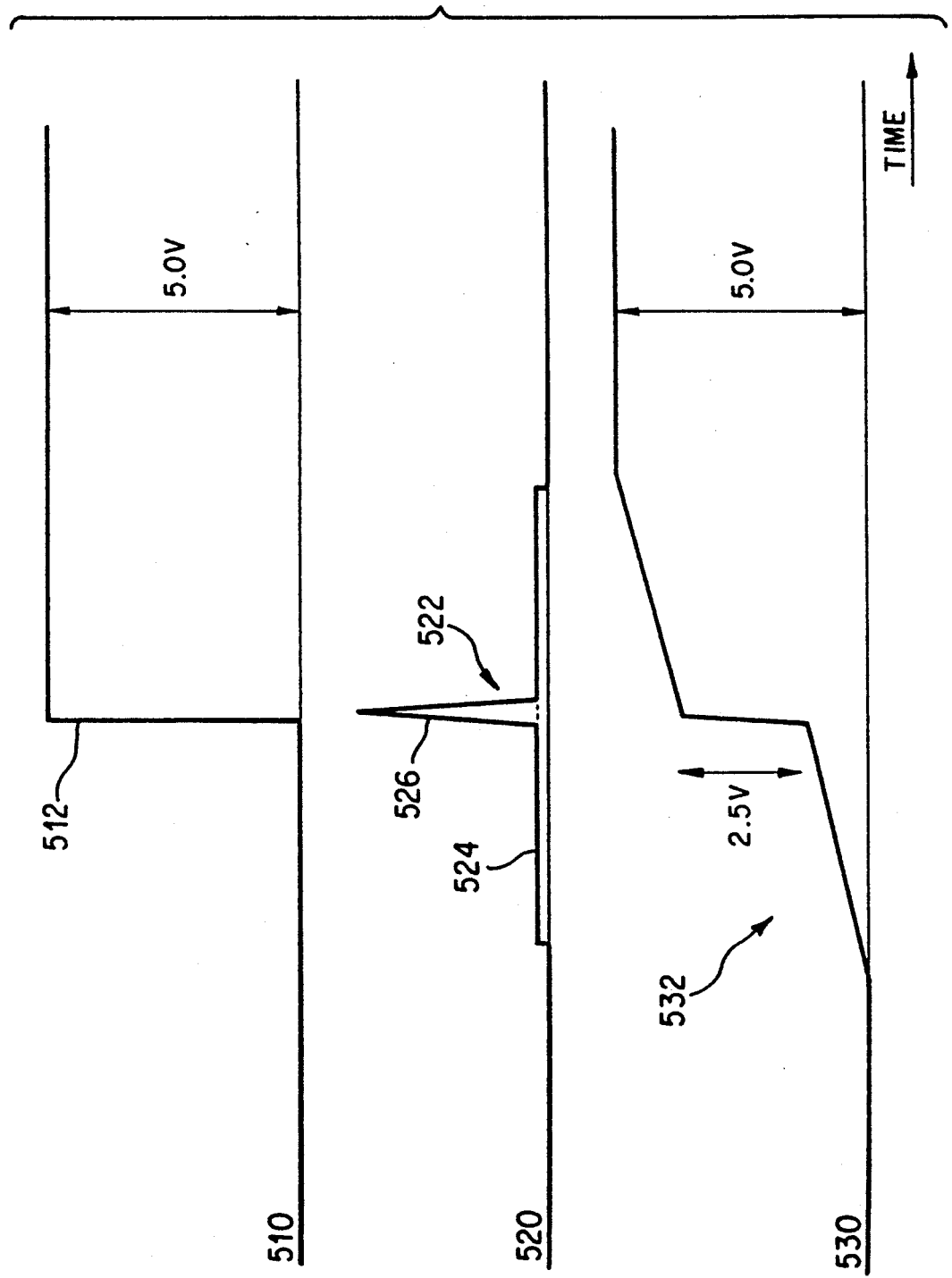
FIG. 5 illustrates a prior-art problem of measuring a step function in the presence of unwanted background noise.
Figure 6:
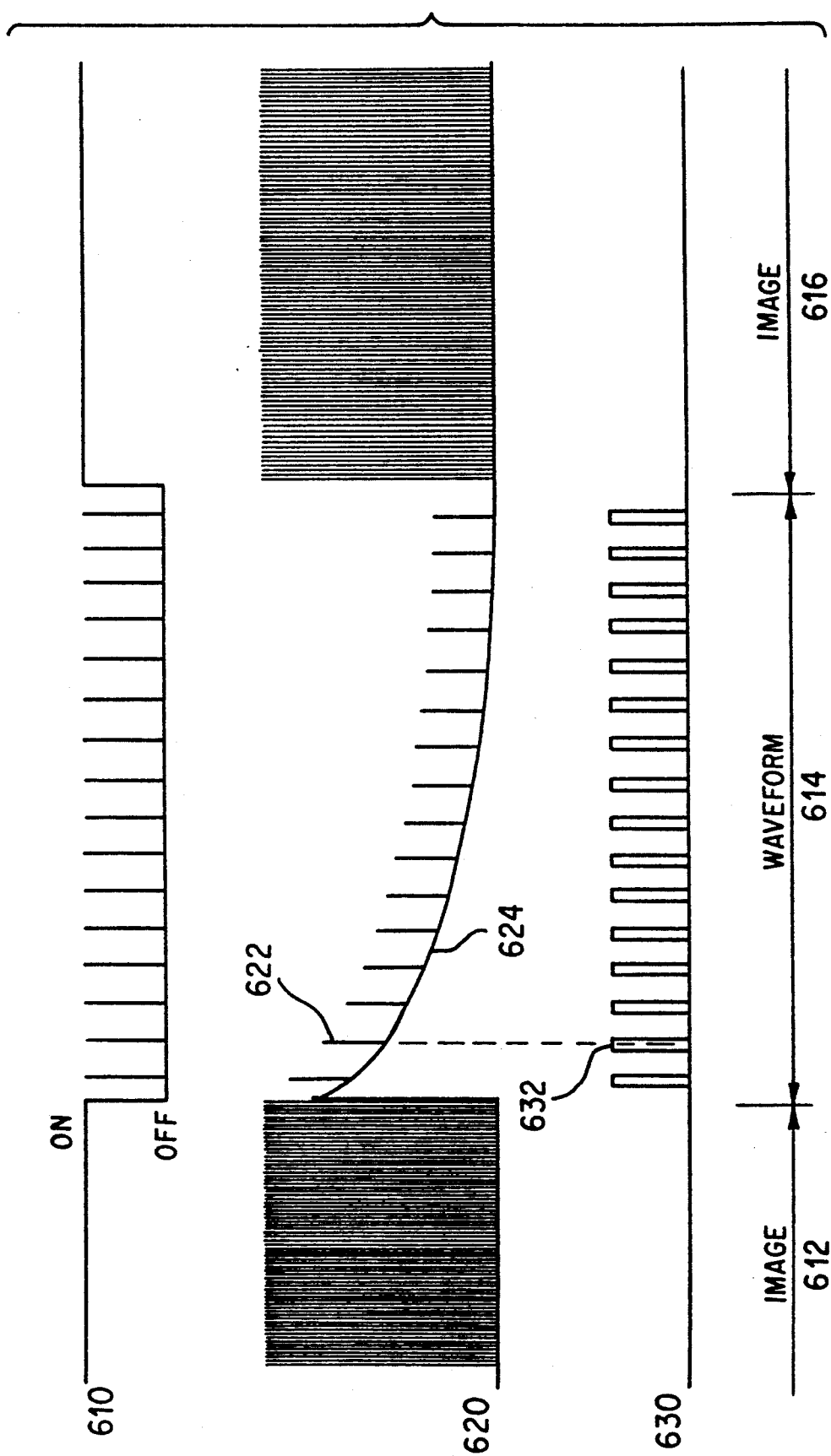
FIG. 6 illustrates a prior-art problem of noise due to scintillator afterglow in multiplexed waveform/image acquisition.
Figure 8:
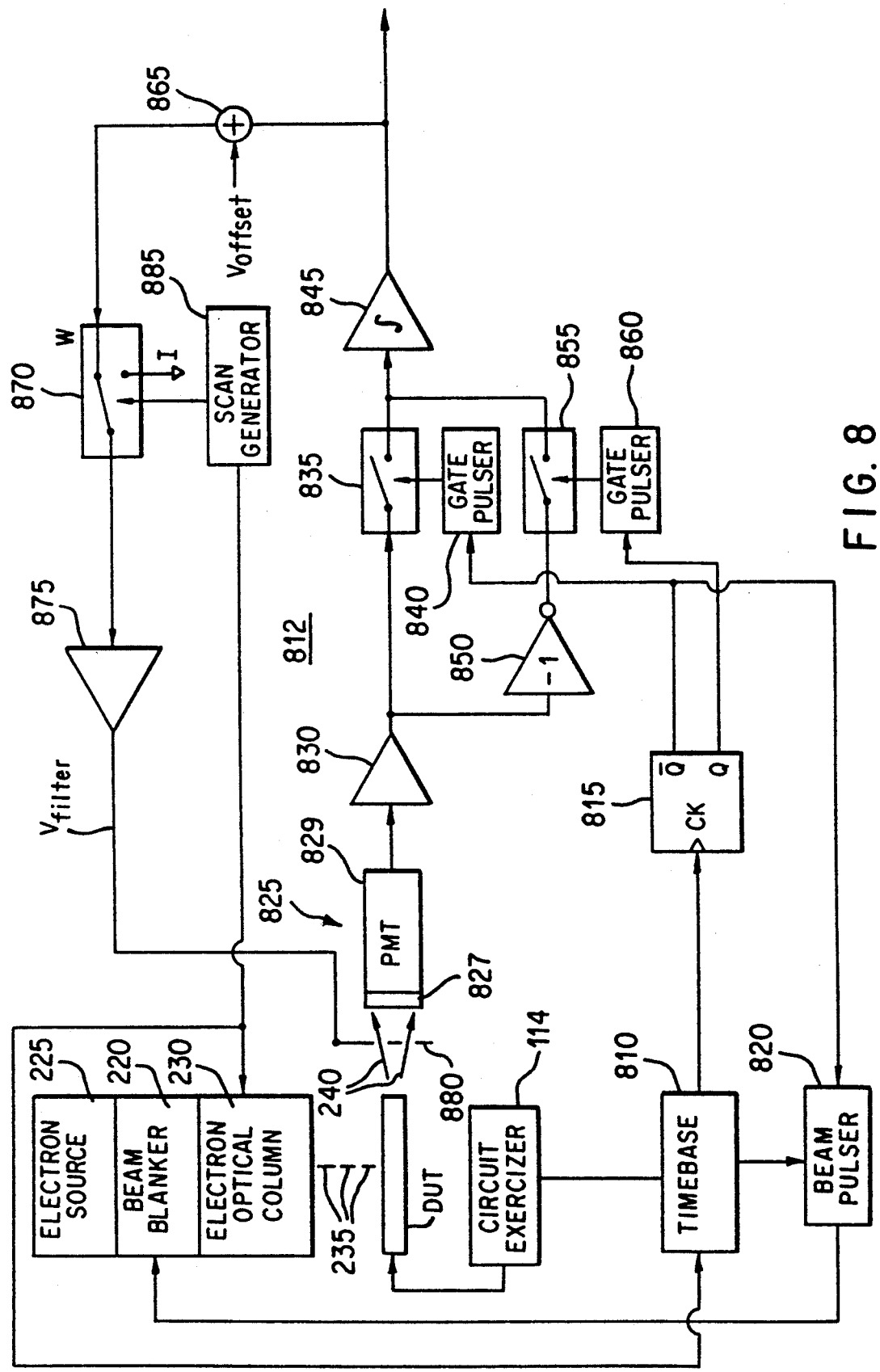
FIG. 8 is a block diagram of a first configuration of an electron-beam test probe system in accordance with the invention.

FIG. 8 is a functional block diagram of an electron-beam test probe system configured for voltage measurement in accordance with the invention. As the configuration of FIG. 8 is similar in some respects to the prior art system discussed above with reference to FIG. 2, like reference numerals are used to refer to certain like components.

Referring to FIG. 8, circuit exerciser 114 exercises the DUT by applying to it a repetitive test signal pattern. Circuit exerciser 114 also sends synchronized timing signals to a timebase circuit 810 within a modified test probe 812. Timebase circuit 810 supplies a train of clock pulses to the clock input of a flip-flop 815. Two clock pulses are supplied for each electron-beam pulse to be applied to the DUT. Alternate clock pulses cause the $\overline{Q}$ output of flip-flop 815 to go "high." Each time the $\overline{Q}$ output of flip-flop 815 goes "high," beam pulser 820 causes beam blanker 220 to unblank the electron beam produced by electron source 225. The resulting electron-beam pulses 235 are focused by electron-optical column 230 and applied to a conductor of interest within the DUT. Secondary electrons 240 emitted from the DUT are detected by electron detector 825, which comprises a scintillator 827 and a photomultiplier 829. Photomultiplier 829 supplies an electron-detector output signal via buffer 830 to gate switch 835. Also, each time the $\overline{Q}$ output of flip-flop 815 goes "high," a gate pulser 840 closes gate switch 835 for a predetermined "gate-open" sampling duration. Samples of the electron-detector signal are thus supplied to integrator 845 by gate switch 835; for example, one such sample is supplied to integrator 845 for each electron beam pulse 235 applied to the DUT.

The electron-detector output signal from buffer 830 is also supplied to an inverter 850, which provides the complement of the electron-detector output signal to a gate switch 855. Alternate clock pulses supplied by timebase 810 to the clock input of flip-flop 815 will cause the Q output of flip-flop 815 to go "high." Each time the Q output of flip-flop 815 goes "high," a gate pulser 860 closes gate switch 855 for a predetermined "gate-open" sampling duration. Samples of the complement (inverse) of the electron-detector signal are thus supplied to integrator 845 by gate switch 855. One such complementary sample is preferably supplied to integrator 845 for each electron beam pulse 235 applied to the DUT.

However, the complementary samples from gate switch 855 are preferably time-shifted relative to the samples from gate switch 835 by one-half of the electron-beam pulse repetition period. The sampled portions of the detector output signal from gate switches 835 and 855 are supplied to integrator circuit 845.

The measured voltage output from integrator circuit 845 is added to an offset voltage $V_{Offset}$ in a summer 865, and the result is passed via a switch 870 to a buffer 875. A filter voltage $V_{Filter}$ is supplied by buffer 875 to a secondary-electron retarding grid 880. Offset voltage $V_{Offset}$ sets the operating point of retarding grid 880. Switch 870 is operated by a scan generator 885 which also controls the beam deflection coils (not illustrated) within electron-optical column 230. During waveform acquisition, switch 870 is maintained in the "W" position (as illustrated) by a mode signal from scan generator 885, while a beam-vectoring signal is supplied by scan generator 885 to the deflection coils to direct the electron beam at a conductor of the DUT. During image acquisition, switch 870 is maintained in the "I" position by the mode signal from scan generator 885, while a beam-rastering signal is supplied by scan generator 885 to the deflection coils to raster-scan the electron beam over a region of the DUT.

Figure 9:
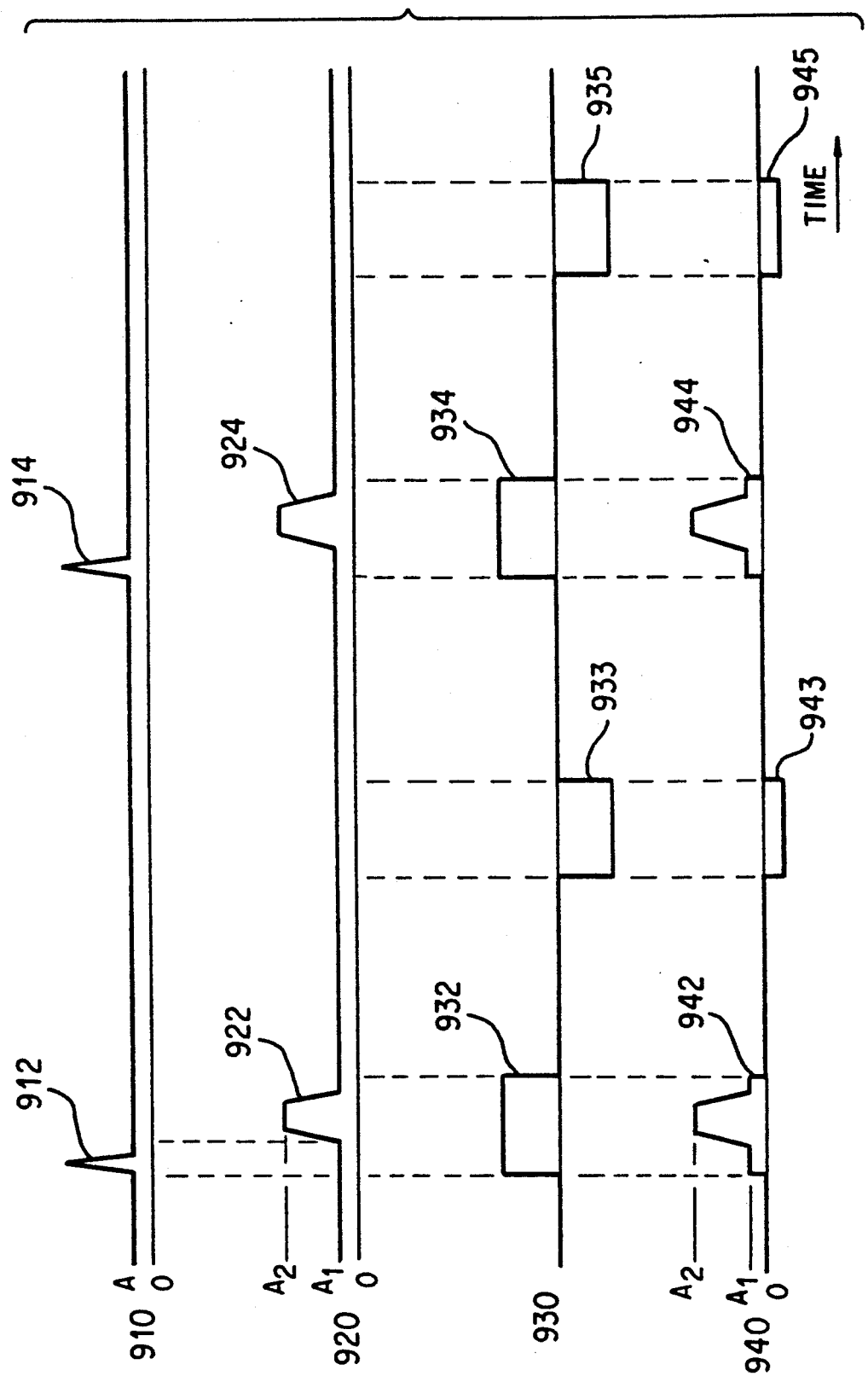
FIG. 9 is a timing diagram illustrating a sampling scheme for an electron-beam test probe system in accordance with the invention.

FIG. 9 illustrates an improved waveform-acquisition sampling scheme in accordance with the present invention, which may be implemented with the test system configuration of FIG. 8. To simplify the illustration, it is assumed that one beam pulse is applied to the DUT for each repetition of the test pattern applied to the DUT by circuit exerciser 114, and that one sample (e.g., a sample from either gate 835 or gate 855) is taken for each repetition of the test pattern applied to the DUT. It will be understood, however that samples may be taken during multiple intervals of the test pattern sequence, and integrated interval-by-interval to produce a measured waveform. That is, the samples from the first interval of multiple repetitions of the test pattern are integrated to produce a voltage measurement for the first interval, the pairs of samples from the second interval of multiple repetitions of the test pattern are integrated to produce a voltage measurement for the second interval, and so on. The voltage measurements for the multiple sampling intervals may be displayed and/or recorded as a measured waveform in conventional fashion.

Referring to FIG. 9, line 910 shows a sequence of electron-beam pulses 912, 914, etc., which are applied to a DUT over time. For purposes of comparison with the prior art scheme of FIG. 7, the electron-beam pulses of line 910 are shown having a repetition frequency one-half that of the electron beam pulses of FIG. 7; that is, alternate electron-beam pulses are "held off." At some time after each of electron-beam pulses 912-914 is applied to the DUT, a corresponding one of secondary-electron "spikes" 922, 924, appears in the electron-detector output signal as shown in line 920.

The electron-detector output signal is sampled by gate switch 835 (FIG. 8) during gate-function "windows" 932, 934, etc., shown in line 930 of FIG. 9. The gate-function windows are timed so that each overlaps in time a respective one of the secondary-electron "spikes" 922, 924, etc., of the electron-detector output signal. In addition, the electron-detector output signal is sampled by gate switch 855 (FIG. 8) during gate function "windows" 933, 935, etc. Gate-function "windows" 933, 935, etc., are interlaced with gate-function "windows" 932, 934, etc., and timed so as to not include the secondary electron "spikes" of the electron-detector output signal but to sample the unwanted background noise. Gate function "windows" 933, 935 are shown inverted to illustrate that the samples taken by gate switch 855 are the inverse of the electron-detector output signal. Line 940 of FIG. 9 shows resulting samples 942, 944 which include a desired secondary-electron component and an unwanted background noise component. Line 940 also shows resulting samples 943 and 945 which include the complement of the unwanted background noise. Combining pairs of samples 942 and 943, 944 and 945, etc., at integrator circuit 845 (FIG. 8) produces a voltage measurement substantially free of unwanted background noise such as that resulting from forward-scattered electrons. Also, an unwanted background noise component resulting from scintillator afterglow is substantially cancelled if the time between samples (e.g., the time between samples 942 and 943) is small relative to typical decay time of the noise component due to scintillator afterglow.

The background noise in the samples (e.g., in sample 942) is illustrated in FIG. 9 as being of constant amplitude $A_1$. Those of skill in the art will recognize that the background noise in the detector output signal due to interaction of forward-scattered electrons with the DUT will typically vary as the DUT is exercised. That is, the voltage on the conductor being probed with the electron beam will typically change from one interval to another of the test pattern applied to the DUT. The low-level sampling of the conductor due to beam leakage will vary accordingly. However, the voltage on the conductor being probed will be the same at a given interval during each repetition of the test pattern. The sampling scheme of FIG. 9 achieves virtually complete cancellation of the noise due to beam leakage if the samples taken during electron-beam "hold-off" (e.g., samples 943 and 945) are taken at the same interval in the test pattern as are the samples taken when the conductor is sampled with the electron-beam (e.g., samples 942 and 944).

Figure 10:
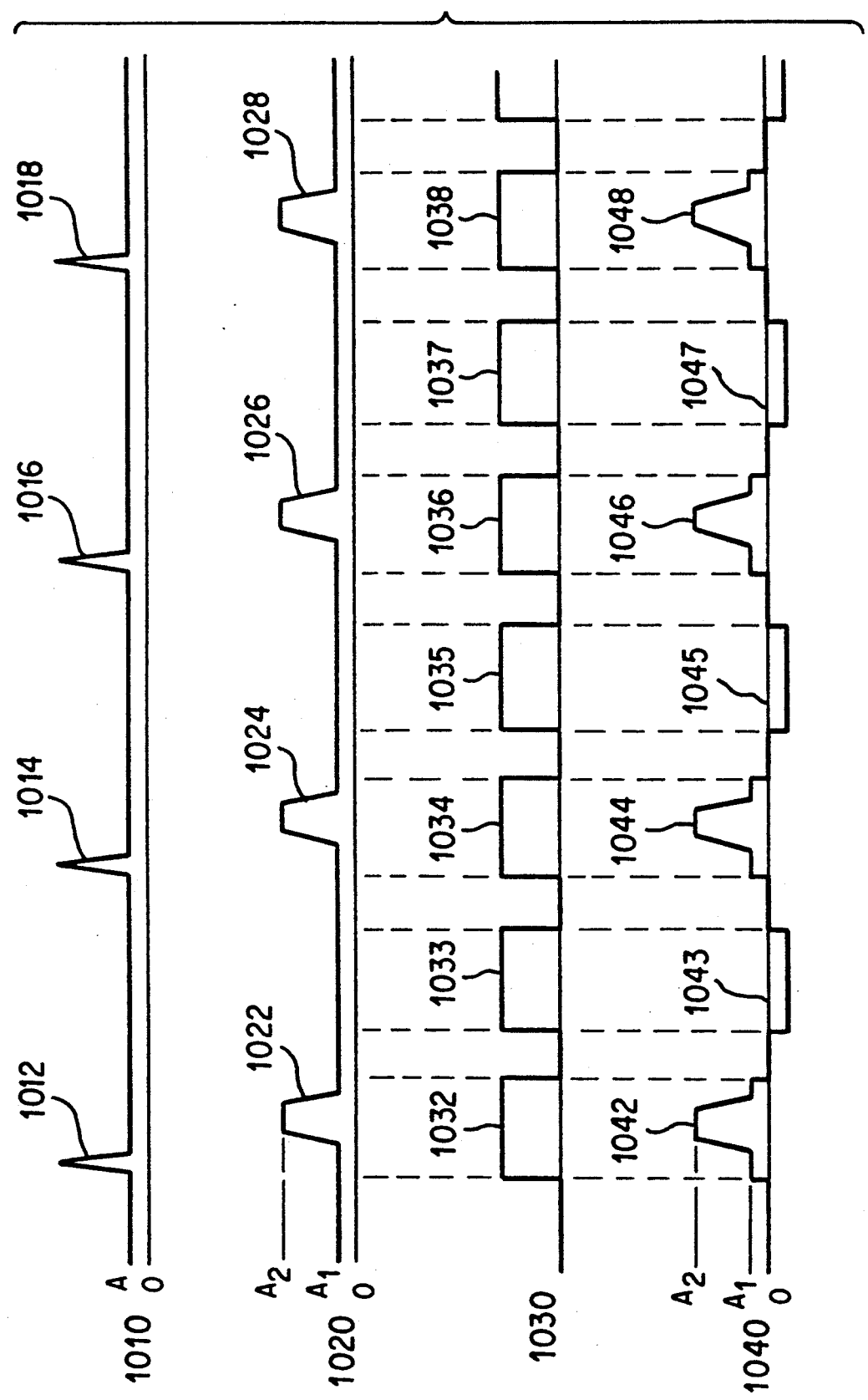
FIG. 10 is a timing diagram illustrating a further sampling scheme for an electron-beam test probe system in accordance with the invention.

FIG. 10 illustrates another sampling scheme in accordance with the present invention, which may also be implemented with the test system configuration of FIG. 8. Line 1010 shows a sequence of electron-beam pulses 1012, 1014, etc., which are applied to a DUT over time. At some time after each of electron-beam pulses 1012–1018 is applied to the DUT, a corresponding one of secondary-electron "spikes" 1022, 1024, etc., appears in the electron-detector output signal as shown in line 1020.

The electron-detector output signal is sampled by gate switch 835 (FIG. 8) during gate function "windows" 1032, 1034, etc., shown in line 1030 of FIG. 10. The gate function windows are timed so that each overlaps in time a respective one of the secondary-electron "spikes" 1022, 1024, etc., of the electron-detector output signal. In addition, the electron-detector output signal is sampled by gate switch 855 (FIG. 8) during gate function "windows" 1033, 1035, etc. Gate-function "windows" 1033, 1035, etc., are interlaced with gate-function "windows" 1032, 1034, etc., and timed so as to not include the secondary electron "spikes" of the electron-detector output signal but to sample the unwanted background noise. Gate function "windows" 1033, 1035 are shown inverted to illustrate that the samples taken by gate switch 855 are the inverse of the electron-detector output signal.

Line 1040 of FIG. 10 shows resulting samples 1042, 1044, etc., which include a desired secondary-electron component and an unwanted background noise component. Line 1040 also shows resulting samples 1043, 1045, etc., which include the complement of the unwanted background noise. In contrast to the scheme of FIG. 9, there is no electron-beam pulse "hold-off"; the "noise" samples (e.g., sample 1043) are taken during a different interval of the test pattern applied to the DUT than are the "signal-plus-noise" samples (e.g., sample 1042). Combining pairs of samples 1042 and 1043, 1044 and 1045, etc., at integrator circuit 845 (FIG. 8) produces a voltage measurement substantially free of unwanted background noise. An unwanted background noise component resulting from scintillator afterglow is substantially cancelled if the time between samples (e.g., the time between samples 1042 and 1043) is small relative to the typical decay time of the noise component due to afterglow. However, cancellation of unwanted background noise due to the beam leakage may be somewhat less effective than with the scheme of FIG. 9, if the conductor being probed is at a different voltage when the "noise" samples (e.g., sample 1043) are taken than when the "signal-plus-noise" samples (e.g., sample 1042) are taken.

Figure 7:
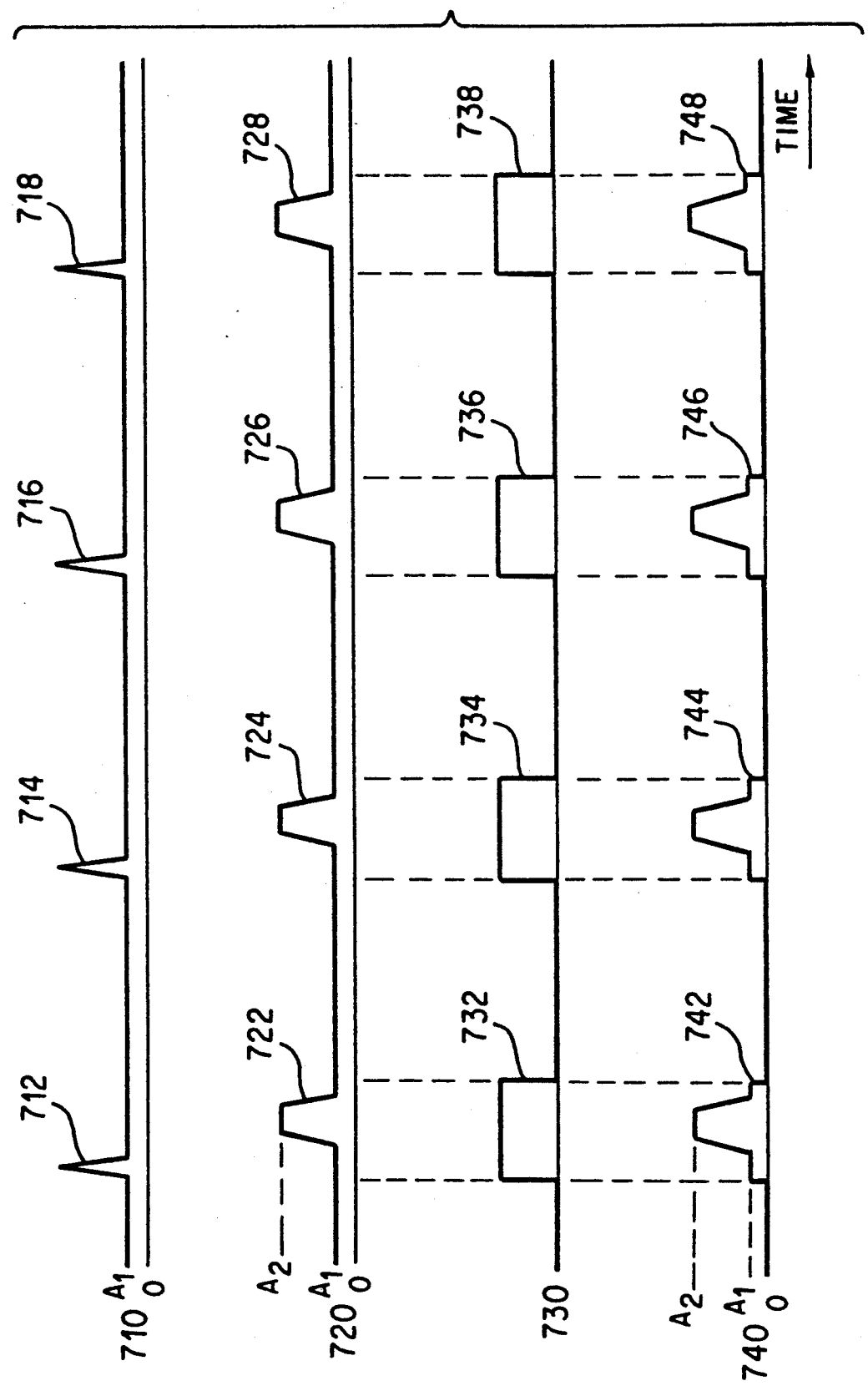
FIG. 7 illustrates a prior-art scheme of sampling a secondary-electron detector signal during waveform acquisition.

As with FIG. 7, the relative durations of beam pulses, gate-function "windows" and the like are not drawn to scale in FIGS. 9 and 10, in order to better illustrate the sampling scheme. The electron-beam pulse repetition frequency may be decreased by the scheme illustrated in FIG. 9 as compared with the prior-art scheme illustrated in FIG. 7 (due to "hold-off" of alternate electron-beam pulses), requiring a correspondingly longer time to acquire a waveform measurement. However, if the scheme of FIG. 10 offers adequate noise cancellation in a particular case, the electron beam pulse repetition frequency may be maintained at conventional rates (i.e., without "holding off" alternate electron-beam pulses) and the waveform acquisition time need not suffer.

Figure 11:
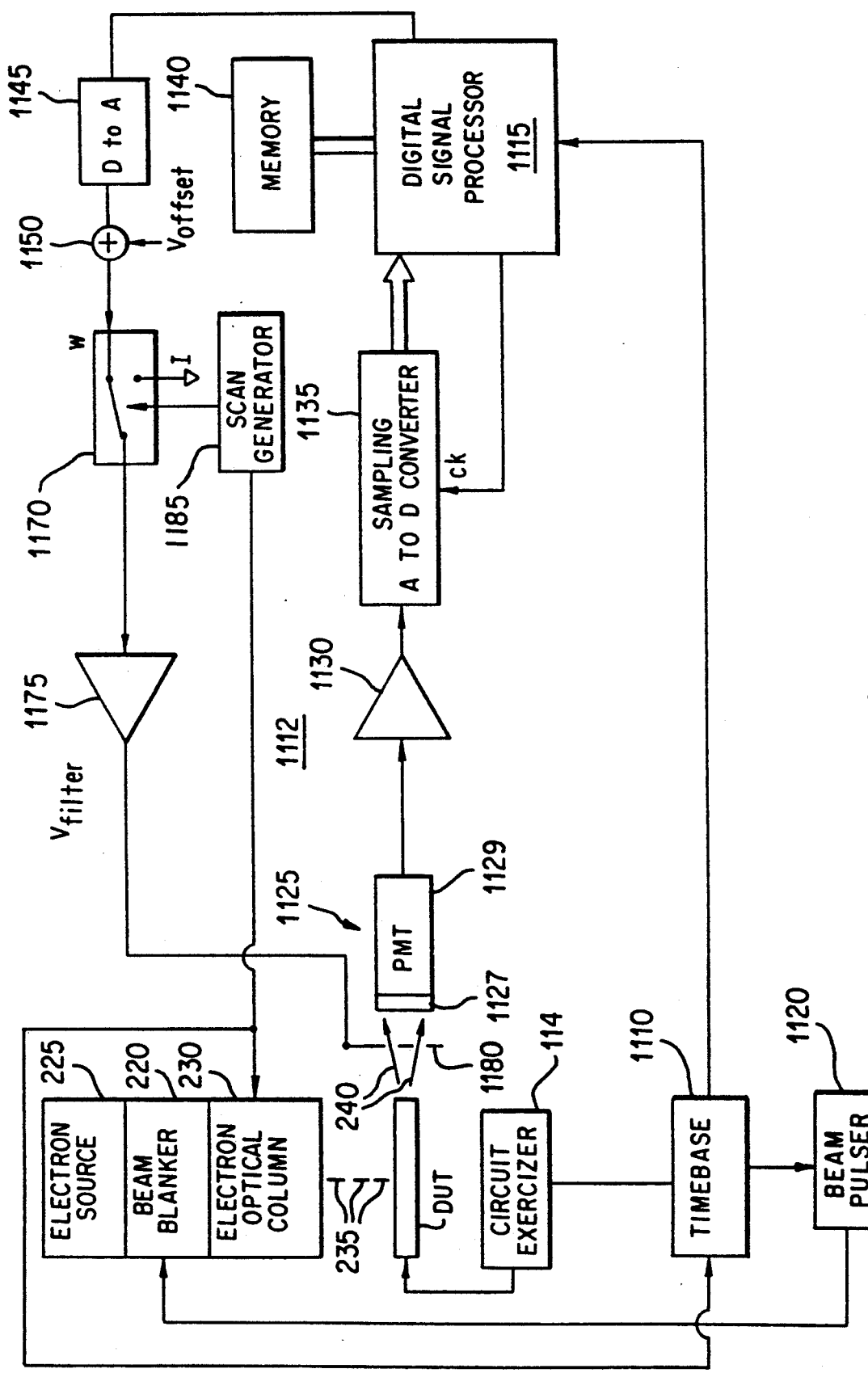
FIG. 11 is a functional block diagram of a second configuration of an electron-beam test probe system in accordance with the invention.

The sampling schemes described above may also be implemented without resort to analog gates and integrators if a high speed digitizer and digital signal processor are used, as shown in the tester configuration of FIG. 11. Referring to FIG. 11, circuit exerciser 114 applies a repetitive pattern of signals to exercise the DUT, and sends timing signals to a timebase circuit 1110 within a modified test probe 1112. Timebase circuit 1110 supplies synchronization signals to a digital signal processor 1115 and to a beam pulser 1120. Beam pulser 1120 causes beam blanker 220 to unblank the electron beam produced by electron source 225. The resulting electron-beam pulses 235 are focused by electron-optical column 230 and applied to a conductor of interest within the DUT. Secondary electrons 240 emitted from the DUT are detected by electron detector 1125, which comprises a scintillator 1127 and a photomultiplier 1129. Photomultiplier 1129 supplies an electron-detector output signal via buffer 1130 to a sampling analog-to-digital converter 1135. The sampling A-to-D converter 1135 operates under control of a clock signal from digital signal processor 1115. The sampling clock period is substantially less than the secondary-electron signal pulse width at the input to the sampling A to D converter. The gating and integrating functions are then performed entirely digitally. Digitized samples of the electron-detector output signal are supplied to signal processor 1115 for integration and/or storage in associated memory 1140.

A measured-voltage signal from signal processor 1115 converted to an analog voltage in a digital-to-analog converter 1145 and added to an offset voltage $V_{offset}$ in a summer 1150, and the result is passed via a switch 1170 to a buffer 1175. A filter voltage $V_{Filter}$ is supplied by buffer 1175 to a secondary-electron retarding grid 1180. Offset voltage $V_{Offset}$ sets the operating point of retarding grid 1180. Switch 1170 is operated by a scan generator 1185 which also controls the beam deflection coils (not illustrated) within electron-optical column 230. During waveform acquisition, switch 1170 is maintained in the "W" position (as illustrated) by a mode signal from scan generator 1185, while a beam-vectoring signal is supplied by scan generator 1185 to the deflection coils to direct the electron beam at a conductor of the DUT. During image acquisition, switch 1170 is maintained in the "I" position by the mode signal from scan generator 1185, while a beam-rastering signal is supplied by scan generator 1185 to the deflection coils to raster-scan the electron beam over a region of the DUT.

A variety of sampling schemes may be implemented with the configuration of FIG. 11. For example, the scheme employing "hold-off" of alternate electron-beam pulses as illustrated in FIG. 9 may be implemented. Signal processor 1115 obtains from converter 1135, and then combines, digitized samples containing the desired secondary-electron information and an unwanted noise component (e.g., samples 942 and 944 of FIG. 9) with the complement of digitized samples containing the desired secondary-electron information and an unwanted noise component (e.g., samples 1042 and 1044 of FIG. 10) with the complement of digitized samples containing the unwanted noise component (e.g., samples 1043 and 1045).

Figure 12:
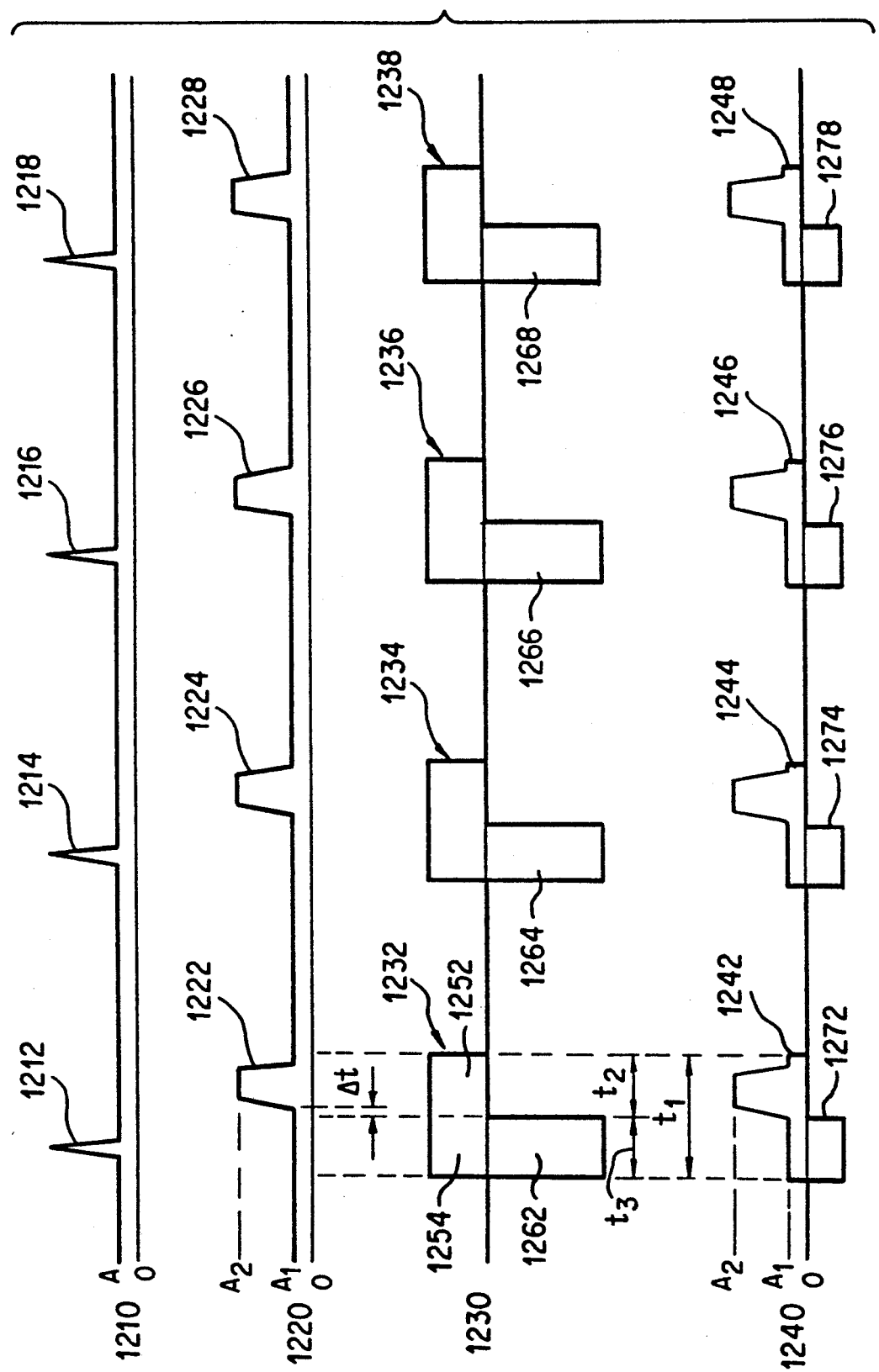
FIG. 12 is a timing diagram illustrating a further sampling scheme for an electron-beam test probe system in accordance with the invention.

FIG. 12 illustrates another sampling scheme in accordance with the invention. The scheme of FIG. 12 may be implemented with the electron-beam tester configuration of FIG. 11, or with a slightly modified version of the analog configuration of FIG. 8. Line 1210 shows a sequence of electron-beam pulses 1212, 1214, etc., which are applied to a DUT over time. At some time after each of electron-beam pulses 1212-1218 is applied to the DUT, a corresponding one of secondary-electron "spikes" 1222, 1224, etc., appears in the electron-detector output signal as shown in line 1220.

The electron-detector output signal is sampled by A-to-D converter 1135 (FIG. 11) during gate function "windows" 1232, 1234, etc., shown in line 1230 of FIG. 12. The gate function windows, each having a duration $t_1$, are timed so that a portion of each overlaps in time a respective one of the secondary-electron "spikes" 1222, 1224, etc., of the electron-detector output signal. For example, a portion 1252 of window 1232 having a duration $t_2$ overlaps secondary-electron "spike" 1222. Another portion of each gate function window does not overlap a secondary electron "spike." For example, a portion 1254 of window 1232 having a duration $t_3$ ends prior to the beginning of secondary-electron "spike" 1222.

Signal processor 1115 receives an entire sample of the electron-detector signal during a gate-function window. For example, sample 1242 is received during gate-function window 1232, sample 1244 is received during gate-function window 1234, etc. Digital processor 1115 takes the complement of a portion of each sample and applies a gain to the complement. For example, the complement of portion 1254 of sample 1232 (having duration $t_3$) is taken, and a gain is applied. The applied gain is preferably such that the unwanted background noise component of the sample will be cancelled when combined with the complement of the sample portion to which the gain has been applied. That is, the gain G applied to the complement of portion 1254 is preferably equal to $t_1/t_3$ if the gain applied to entire sample 1232 is unity. The principle is illustrated in FIG. 12 by the complementary "gate-function" blocks 1262-1268; for example, the "duration" of block 1262 is $t_3$ and its area is equal to the area of gate-function block 1232, representing gain to be applied to portion 1254.

The complements of the portions of the samples to which gain has been applied are as shown in line 1240 at 1272, 1274, 1276, 1278, etc. Combining each sample in processor 1115 with the amplified complementary sample portion effects substantial cancellation of the unwanted background noise component of the sample. For example, combining processed sample portion 1272 with sample 1242 produces a voltage-measurement sample which is substantially free of unwanted background noise such as that resulting from forward-scattered electrons. Since the "noise" sample (e.g., processed sample portion 1272) is taken during the same interval of the test sequence at the "signal-plus-noise" sample (e.g., sample 1242), noise cancellation is virtually as complete as with the electron-beam "hold-off" scheme of FIG. 9. An unwanted background noise component resulting from scintillator afterglow is also substantially cancelled with this scheme. As with FIGS. 7, 9 and 10, the relative durations of beam pulses, gate-function "windows" and the like are not drawn to scale in FIG. 12, in order to better illustrate the sampling scheme.

As noted above, the analog electron-beam tester configuration of FIG. 8 may be readily modified to carry out the sampling scheme of FIG. 11. For example, flip-flop 815 may be replaced by a circuit which provides for gate switch 835 to close during "gate-open" intervals 1232, 1234, etc., and for gate switch 855 to close during "gate-open" intervals 1262, 1264, etc. A gain equal to $t_1/t_3$ is then applied to the samples from gate 855 if the gain applied to the samples from gate 835 is unity.

Figure 13:
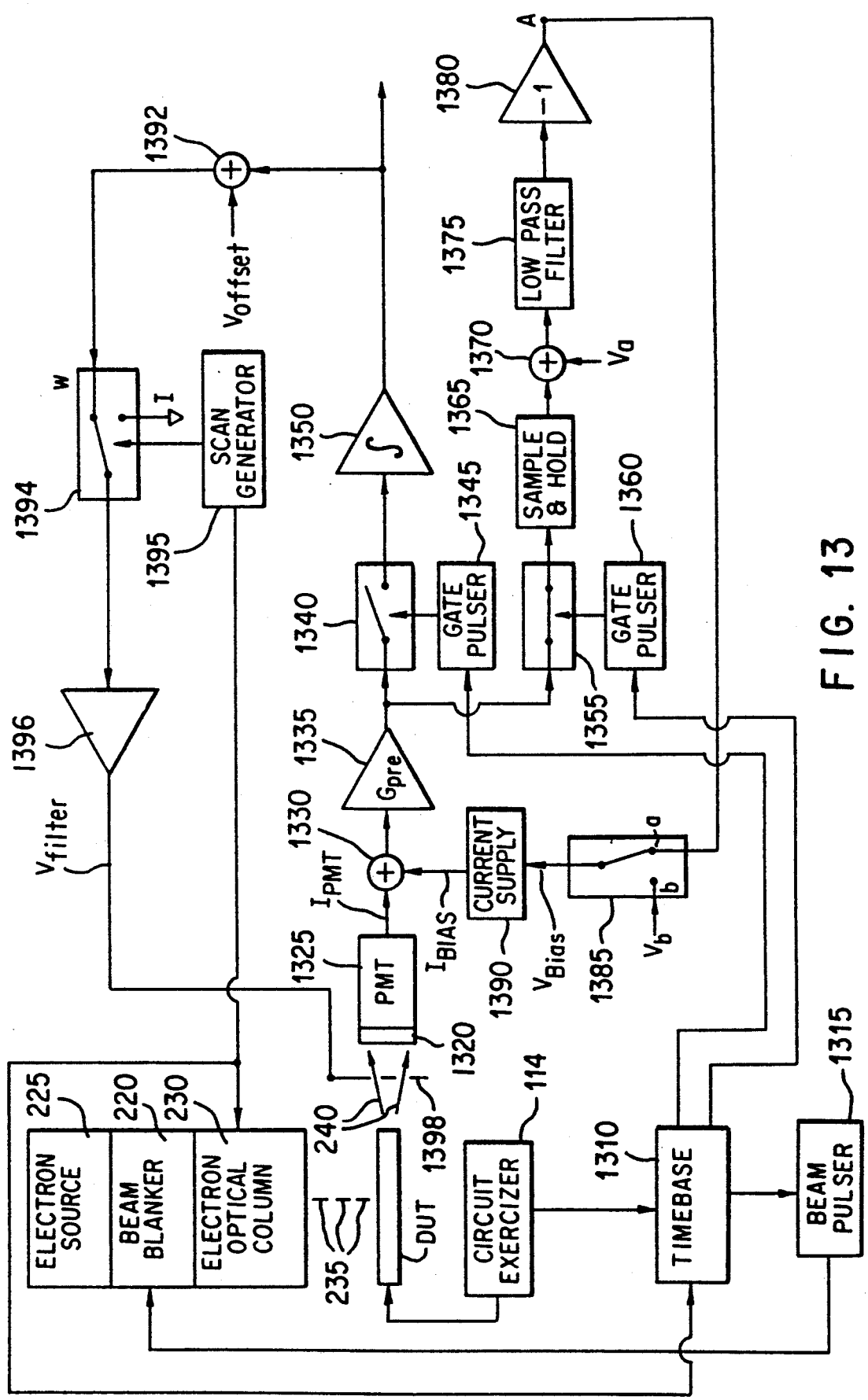
FIG. 13 is functional block diagram of a third configuration of an electron-beam test probe system in accordance with the invention.

FIG. 13 illustrates a further embodiment of an electron-beam test system in accordance with the invention. Referring to FIG. 13, circuit exerciser 114 applies a repetitive pattern of signals to exercise the DUT, and sends timing signals to a timebase circuit 1310. Timebase circuit 1310 controls a beam pulser 1315 which supplies a train of control pulses to beam blanker 220. In response to the control pulses from beam pulser 1315, beam blanker 220 periodically unblanks a beam of electrons produced by an electron source 225. The resulting train of electron-beam pulses 235 is focused in an electron optical column 230, and directed at a conductor in interest inside the DUT.

Voltage measurement is achieved by detecting and analyzing the energies of secondary electrons 240 which are generated during the interaction of the electron-beam pulses 235 with the DUT. An electron detector comprising a scintillator 1320 and a photomultiplier 1325 detects the secondary electrons 240, and provides a detector output signal, current $I_{PMT}$, at the output of photomultiplier 1325. Current $I_{PMT}$ is combined with a bias current $I_{Bias}$ at summer 1355, and the resulting current is supplied to a pre-amplifier which applies a gain $G_{pre}$. The signal at the output of pre-amplifier 1335 is supplied to a gate switch 1340 which is controlled by a gate pulser 1345. When gate switch 1340 is closed, a sample of the signal from pre-amplifier 1355 is supplied to an integrator 1350. The measured voltage, or voltage waveform, is provided at the output of integrator 1350.

The signal at the output of pre-amplifier 1335 is also supplied to a gate switch 1355 which is controlled by a gate pulser 1360. When gate switch 1355 is closed, a sample of the signal from pre-amplifier 1355 is supplied to a sample-and-hold circuit 1365. The voltage stored in sample-and-hold circuit 1365 is combined at summer 1370 with a bias-adjustment voltage $V_a$, and the resulting voltage is supplied to a low-pass filter 1375 for smoothing. The signal from low-pass filter 1375 is inverted by an inverter 1380, and supplied to terminal a of a switch 1385. A voltage $V_{Bias}$ provided by switch 1385 to a voltage-controlled current supply 1390, which in turn supplies bias current $I_{Bias}$. With switch 1385 in position a as illustrated, voltage $V_{Bias}$ is the voltage at point A (the output of inverter 1380); with switch 1385 in the alternate position, voltage $V_{Bias}$ is the bias voltage $V_b$ at terminal b of switch 1385.

The measured waveform voltage from integrator circuit 1350 is added to an offset voltage $V_{Offset}$ in a summer 1392, and the result is passed via a switch 1394 to a buffer 1396. A filter voltage $V_{Filter}$ is supplied by buffer 1396 to a secondary-electron retarding grid 1398. Offset voltage $V_{Offset}$ sets the operating point of retarding grid 1398. Switch 1394 is operated by a scan generator 1395 which also controls the beam deflection coils (not illustrated) within electron-optical column 230. During waveform acquisition, switch 1394 is maintained in the "W" position (as illustrated) by a mode signal from scan generator 1395, while a beam-vectoring signal is supplied by scan generator 1395 to the deflection coils to direct the electron beam at a conductor of the DUT. During image acquisition, switch 1394 is maintained in the "I" position by the mode signal from scan generator 1395, while a beam-rastering signal is supplied by scan generator 1395 to the deflection coils to raster-scan the electron beam over a region of the DUT.

Figure 14:
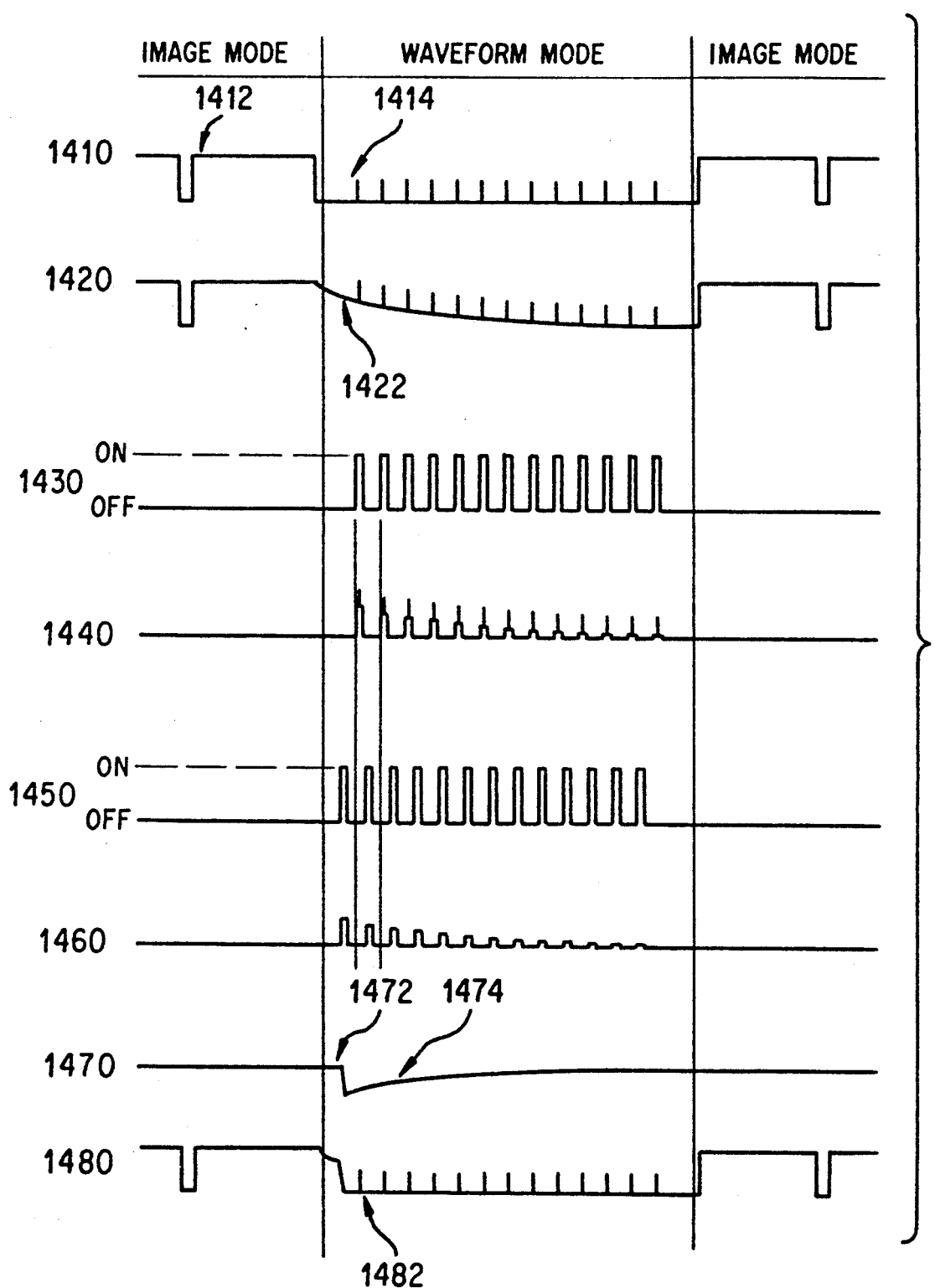
FIG. 14 is a timing diagram illustrating yet another sampling scheme for an electron-beam test probe system in accordance with the invention.

FIG. 14 illustrates the cancellation of noise due to scintillator afterglow in accordance with the invention, and will first be described with reference to the electron-beam tester configuration of FIG. 13. FIG. 14 is divided vertically into three time segments, a first image acquisition mode segment, a waveform acquisition mode segment, and a second image acquisition mode segment. Line 1410 shows the "ideal" output of preamplifier 1335, which includes image data 1412 during image acquisition and pulses or "spikes" 1414 during waveform acquisition. Lines 1420–1440 demonstrate the operation of the system of FIG. 13 with switch 1385 in the b position, rather than in the a position as illustrated. With switch 1385 in the b position, the system of FIG. 13 operates without the cancellation of background noise offered by the present invention. Lines 1450–1480 demonstrate the improved operation of the system of FIG. 13 with the benefit of multiplex noise cancellation in accordance with the present invention (i.e., with switch 1385 in the a position as illustrated).

As shown in line 1420, a slowly-decaying, unwanted background noise component 1422 is superposed on the waveform acquisition segment of the electron-detector signal due to scintillator afterglow. Line 1430 shows the timing of gate-switch 1340. The gate-open windows of gate-switch 1340 are synchronized with the electron-beam pulses applied to the DUT so that samples as shown in line 1440 are supplied to integrator 1350 when switch 1385 is in the b position. The detector-output signal samples of line 1440 contain not only the desired secondary-electron information 1414 but also samples of the unwanted background noise component 1422.

Cancellation of the unwanted background noise component may be achieved with the configuration of FIG. 13 as follows. Switch 1385 is placed in the a position. Gate switch 1355 is closed periodically as shown in line 1450 of FIG. 14. The "gate-open" times of gate switch 1355 are interlaced with those of gate switch 1340 so as to produce an output signal from gate switch 1355 as shown in line 1460 (i.e., the samples supplied to sample-and-hold circuit 1365 are of the unwanted background noise). The samples of line 1460 are smoothed by sample-and-hold circuit 1365 and low-pass filter 1375, then inverted by inverter 1380. The waveform at the output (point A) of inverter 1380 is as shown in line 1470; after a short delay time 1472, the signal at 1474 is the inverse of the background noise 1422. The waveform at point A is converted from a voltage signal to a current signal $I_{Bias}$ at 1390, and added to the photomultiplier output current $I_{PMT}$ at 1330. The resulting signal 1482 supplied to gate 1340 is shown at line 1480. The signal of line 1480 is nearly the "ideal" signal of line 1410, as substantially all of the unwanted background noise due to scintillator afterglow is cancelled.

Cancellation of noise due to scintillator afterglow is similarly effected with the tester configurations and sampling schemes described with reference to FIGS. 8–12. For example, if the detector output signal at line 920 of FIG. 9 includes noise due to scintillator afterglow, it is comparable to line 1420 of FIG. 14. The "signal-plus-noise" samples (e.g., samples 942 and 944 of FIG. 9) thus include a decaying component due to afterglow like the samples in line 1440 of FIG. 14. The "noise" samples (e.g., samples 943 and 945 of FIG. 9) include the inverse of the decaying component due to afterglow, or the inverse of the samples in line 1460 to FIG. 14. Combining the samples results in cancellation of the noise due to scintillator afterglow.

Those of skill in the art will recognize that the present invention is not limited to the specific embodiments described above, and that many modifications are possible within the spirit and scope of the invention as defined in the following claims. By way of example, the sampling schemes of the present invention may be combined with the prior-art techniques of delaying and shortening the gate-function windows, thereby reducing somewhat the amount of background noise to be cancelled with the schemes of the present invention.

We claim:

1. Apparatus for measuring voltage of a conductor of an integrated circuit, comprising:
  a. exerciser means for exercising an integrated circuit by applying a repetitive signal pattern to the integrated circuit;
  b. blanker means for repetitively blanking and unblanking an electron beam synchronously with the repetitive signal pattern to thereby produce electron-beam sampling pulses during periodic first time intervals when the electron beam is unblanked, and wherein blanking of the electron beam is incomplete such that a portion of the electron beam is passed as forward-scattered electrons during periodic second time intervals between the periodic first time intervals;
  c. probe means for probing a conductor of the integrated circuit by applying the electron-beam sampling pulses and the forward-scattered electrons to the integrated circuit;
  d. detector means for detecting secondary electrons emitted from the integrated circuit to produce a detector signal, the detector signal having periodic first signal portions with levels substantially dependent upon interaction of the electron-beam sampling pulses with said conductor and the detector signal having periodic second signal portions with levels primarily dependent upon interaction of the forward-scattered electrons with said integrated circuit;
  e. sampling means for sampling the detector signal during said first signal portions and during said second signal portions; and
  f. combining means for combining the sampled first signal portions with the complement of the sampled second signal portions to produce a measured voltage signal representing voltage of said conductor.

2. The apparatus of claim 1, wherein said sampling means comprises means for periodically sampling the detector signal in phase with said periodic first time intervals and for sampling the detector signal during said periodic second time intervals and out of phase with said periodic first time intervals.

3. The apparatus of claim 1, wherein:
  i. said exerciser means comprises means for applying to the integrated circuit a repetitive signal pattern having a plurality of test pattern intervals such that voltage on the conductor changes as the signal pattern is applied to the integrated circuit while voltage on the conductor at any given interval of the signal pattern is substantially the same during each repetition of the signal pattern;
  ii. said blanker means comprises means for unblanking the electron beam during alternate repetitions of the signal pattern applied to the integrated circuit; and
  iii. said sampling means comprises means for sampling the detector signal during said first signal portions over a time window corresponding to a selected interval of the signal pattern, and for sampling the detector signal during said second signal portions over a time window corresponding to said selected interval of the signal pattern.

4. The apparatus of claim 1, wherein each said second signal portion of said detector signal comprises a subportion of one of said first signal portions.

5. The apparatus of claim 1, wherein each said first signal portion has a duration $t_1$, wherein each said second signal portion comprises a subportion of one of said first signal portions and has duration $t_2$, and wherein said combining means comprises
 i. means for applying a gain to said second signal portions to produce scaled second signal portions, and
 ii. means for combining said first signal portions with the complement of said scaled second signal portions.

6. Apparatus for measuring voltage of a conductor of an integrated circuit, comprising:
 a. means for exercising an integrated circuit by applying a repetitive signal pattern to the integrated circuit;
 b. means for alternately blanking and unblanking an electron beam synchronously with the repetitive signal pattern to produce a pulsed electron beam;
 c. means for probing a conductor of the integrated circuit by applying the pulsed electron beam to the integrated circuit;
 d. means for detecting secondary electrons emitted from the integrated circuit to produce a detector signal, the detector signal having periodic first signal portions with levels substantially dependent upon interaction of the electron-beam sampling pulses with said conductor and the detector signal having periodic second signal portions with levels substantially independent of interaction of the electron-beam sampling pulses with said conductor, each said first signal portion having a duration $t_1$, and each said second signal portion comprising a subportion of one of said first signal portions and having a duration $t_2$;
 e. means for sampling the detector signal during said first signal portions and during said second signal portions;
 f. means for applying a gain to said sampled second signal portions to produce scaled second signal portions, said applied gain being substantially equal to the ratio $t_1/t_2$, and
 g. means for combining the sampled first signal portions with the complement of the scaled second signal portions to produce a measured voltage signal representing voltage of said conductor.

7. A method of measuring voltage of a conductor of an integrated circuit, comprising:
 a. exercising an integrated circuit by applying a repetitive signal pattern to the integrated circuit;
 b. repetitively blanking and unblanking an electron beam synchronously with the repetitive signal pattern to thereby produce electron-beam sampling pulses during periodic first time intervals when the electron beam is unblanked, and wherein blanking of the electron beam is incomplete such that a portion of the electron beam is passed as forward-scattered electrons during periodic second time intervals between the periodic first time intervals;
 c. probing a conductor of the integrated circuit by applying the electron-beam sampling pulses and the forward-scattered electrons to the integrated circuit;
 d. detecting secondary electrons emitted from the integrated circuit to produce a detector signal, the detector signal having periodic first signal portions with levels substantially dependent upon interaction of the electron-beam sampling pulses with said conductor and the detector signal having periodic second signal portions with levels primarily dependent upon interaction of the forward-scattered electrons with said integrated circuit;
 e. sampling the detector signal during said first signal portions;
 f. sampling the detector signal during said second signal portions; and
 g. combining the sampled first signal portions with the complement of the sampled second signal portions to produce a measured voltage signal representing voltage of said conductor.

8. The method of claim 7, wherein step e. comprises periodically sampling the detector signal in phase with said periodic first time intervals, and wherein step f. comprises sampling the detector signal during said periodic second time intervals and out of phase with said periodic first time intervals.

9. The method of claim 7, wherein
 i. step a. comprises applying to the integrated circuit a repetitive signal pattern having a plurality of test pattern intervals such that voltage on the conductor changes as the signal pattern is applied to the integrated circuit while voltage on the conductor at any given interval of the signal pattern is substantially the same during each repetition of the signal pattern;
 ii. step b. comprises unblanking the electron beam during alternate repetitions of the signal pattern applied to the integrated circuit;
 iii. step e. comprises sampling the detector signal during said first signal portions over a time window corresponding to a selected interval of the signal pattern; and
 iv. step f. comprises sampling the detector signal during said second signal portions over a time window corresponding to said selected interval of the signal pattern.

10. The method of claim 7, wherein each said second signal portion comprises a subportion of one of said first signal portions.

11. The method of claim 7, wherein each said first signal portion has a duration $t_1$, wherein each said second signal portion comprises a subportion of one of said first signal portions and has a duration $t_3$, and wherein step g. comprises
 i. applying a gain to said second signal portions to produce scaled second signal portions, and
 ii. combining said first signal portions with the complement of said scaled second signal portions.

12. A method of measuring voltage of a conductor of an integrated circuit, comprising:
 a. exercising an integrated circuit by applying a repetitive signal pattern to the integrated circuit:
 b. alternately blanking and unblanking an electron beam synchronously with the repetitive signal pattern to produce a pulsed electron beam;
 c. probing a conductor of the integrated circuit by applying the pulsed electron beam to the integrated circuit;
 d. detecting secondary electrons emitted from the integrated circuit to produce a detector signal, the detector signal having periodic first signal portions with levels substantially dependent upon interaction of the electron-beam sampling pulses with said conductor and the detector signal having periodic second signal portions with levels substantially independent of interaction of the electron-beam sampling pulses with said conductor, wherein each said first signal portion has a duration $t_1$, and each said second signal portion comprises a subportion of one of said first signal portions and has a duration $t_3$;

e. sampling the detector signal during said first signal portions;

f. sampling the detector signal during said second signal portions;

g. applying a gain to the sampled second signal portions to produce scaled second signal portions, said applied gain being substantially equal to the ratio $t_1/t_3$, and h. combining the sampled first signal portion with the complement of the scaled second signal portions to produce a measured voltage signal representing voltage of said conductor.

13. A method of acquiring a voltage contrast image of a portion of an integrated circuit and measuring voltage of a conductor of the integrated circuit, comprising:

a. exercising an integrated circuit by applying a repetitive signal pattern to the integrated circuit;

b. generating an electron beam;

c. acquiring a voltage contrast image of a portion of the integrated circuit by
  i. scanning said electron beam over a portion of the integrated circuit during repetitive image-acquisition time intervals,
  ii. employing an electron detector having a scintillator and a photomultiplier to detect secondary electrons emitted from the integrated circuit during said repetitive image-acquisition time intervals to produce an image signal, said scintillator exhibiting time-decaying after-glow following each of said image-acquisition time intervals, and
  iii. generating a voltage contrast image from said image signal; and measuring voltage of a conductor of the integrated circuit by
  i. repetitively blanking and unblanking the electron beam synchronously with the signal pattern during repetitive waveform-acquisition time intervals to thereby produce electron-beam sampling pulses when the electron beam is unblanked, said waveform-acquisition time intervals alternating with said image-acquisition time intervals,
  ii. probing said conductor by applying the electron-beam sampling pulses to said conductor during said waveform-acquisition time intervals,
  iii. employing said electron detector to detect secondary electrons emitted from the integrated circuit during said waveform-acquisition time intervals to produce a detector signal, the detector signal having periodic first signals portions with levels substantially dependent upon interaction of the electron-beam sampling pulses with said conductor and the detector signal having periodic second signal portions with levels substantially independent of interaction of the electron-beam sampling pulses with said conductor, and the detector signal having a time-decaying distortion component due to the after-glow exhibited by the scintillator following each said image-acquisition time interval,
  iv. sampling the detector signal during said first signal portions,
  v. sampling the detector signal during said second signal portions, and
  vi. combining the sampled first signal portions with the complement of the sampled second signal portions to produce a measured voltage signal representing voltage of said conductor, such that said measured voltage signal is substantially free of distortion due to the after-glow exhibited by the scintillator following each said image-acquisition time interval.

14. Apparatus for acquiring a voltage contrast image of a portion of an integrated circuit and measuring voltage of a conductor of the integrated circuit, comprising:

a. means for exercising an integrated circuit by applying a repetitive signal pattern to the integrated circuit;

b. means for generating an electron beam;

c. means for acquiring a voltage contrast image of a portion of the integrated circuit, comprising
  i. means for scanning the electron beam over a portion of the integrated circuit during repetitive image-acquisition time intervals,
  ii. an electron detector having a scintillator and a photomultiplier for detecting secondary electrons emitted from the integrated circuit during said repetitive image-acquisition time intervals to produce an image signal, said scintillator exhibiting time-decaying after-glow following each of said image-acquisition time intervals, and
  iii. means for generating a voltage contrast image from said image signal; and d. means for measuring voltage of a conductor of the integrated circuit, comprising
  i. means for repetitively blanking and unblanking the electron beam synchronously with the signal pattern during repetitive waveform-acquisition time intervals to thereby produce electron-beam sampling pulses when the electron beam is unblanked, said waveform-acquisition time intervals alternating with said image-acquisition time intervals,
  ii. means for probing the conductor by applying the electron-beam sampling pulses to the conductor during said repetitive waveform-acquisition time intervals,
  iii. means comprising said electron detector for detecting secondary electrons emitted from the integrated circuit during said waveform-acquisition time intervals to produce a detector signal, the detector signal having periodic first signal portions with levels substantially dependent upon interaction of the electron-beam sampling pulses with the conductor and the detector signal having periodic second signal portions with levels substantially independent of interaction of the electron-beam sampling pulses with the conductor, and the detector signal having a time-decaying distortion component due to the after-glow exhibited by the scintillator following each said image-acquisition time interval,
  iv. means for sampling the detector signal during said first signal portions and for sampling the detector signal during said second signal portions, and
  v. means for combining the sampled first signal portions with the complement of the sampled second signal portions to produce a measured voltage signal representing voltage of said conductor, such that said measured voltage signal is substantially free of distortion due to the after-glow exhibited by the scintillator following each said image-acquisition time interval.

15. A method of acquiring a voltage contrast image of a portion of an integrated circuit and measuring voltage of a conductor of the integrated circuit, comprising;

a. exercising an integrated circuit by applying a repetitive signal pattern to the integrated circuit;

b. generating an electron beam;
c. acquiring a voltage contrast image of a portion of the integrated circuit by
   i. scanning said electron beam over a portion of the integrated circuit during repetitive image-acquisition time intervals,
   ii. employing an electron detector having a scintillator and a photomultiplier to detect secondary electrons emitted from the integrated circuit during said repetitive image-acquisition time intervals to produce an image signal, said scintillator exhibiting after-glow following each said image-acquisition time interval, and
   iii. generating a voltage contrast image from said image signal; and
d. measuring voltage of a conductor of the integrated circuit by
   i. repetitively blanking and unblanking the electron beam synchronously with the signal pattern during repetitive waveform-acquisition time intervals to thereby produce electron-beam sampling pulses during periodic first time intervals within each waveform-acquisition time interval when the electron beam is unblanked, and wherein blanking of the electron beam is incomplete such that a portion of the electron beam is passed as forward-scattered electrons during periodic second time intervals within each waveform-acquisition time interval, said second time intervals alternating with said first time intervals, and said waveform-acquisition time intervals alternating with said image-acquisition time intervals,
   ii. probing said conductor by applying the electron-beam sampling pulses and the forward-scattered electrons to said conductor during said waveform-acquisition time intervals,
   iii. employing said electron detector to detect secondary electrons emitted from the integrated circuit during said waveform-acquisition time intervals to produce a probe signal, the probe signal having
      a. periodic first signal portions with a signal component substantially dependent upon interaction of the electron-beam sampling pulses with said conductor,
      b. periodic second signal portions with a signal component substantially dependent upon interaction of the forward-scattered electrons with said conductor, and
      c. a time-decaying distortion component due to the after-glow exhibited by the scintillator following each said image-acquisition time interval,
   iv. sampling the probe signal during said first signal portions,
   v. sampling the probe signal during said second signal portions, and
   vi. combining the sampled first signal portions with the complement of the sampled second signal portions to produce a measured voltage signal representing voltage of said conductor, such that said measured voltage signal is substantially free of distortion due to the after-glow exhibited by the scintillator following each said image-acquisition time interval.

16. Apparatus for acquiring a voltage contrast image of a portion of an integrated circuit and measuring voltage of a conductor of the integrated circuit, comprising:
a. a circuit exerciser for exercising an integrated circuit by applying a repetitive signal pattern to the integrated circuit;
b. an electron source for generating an electron beam;
c. a beam blanker for
   i. unblanking the beam during repetitive image-acquisition time intervals and
   ii. repetitively blanking and unblanking the electron beam synchronously with the signal pattern during repetitive waveform-acquisition time intervals to thereby produce electron-beam sampling pulses during periodic first time intervals within each waveform-acquisition time interval when the electron beam is unblanked, the beam blanker providing for incomplete blanking of the electron beam such that a portion of the electron beam is passed as forward-scattered electrons during periodic second time intervals within each waveform-acquisition time interval, said second time intervals alternating with said first time intervals, and said waveform-acquisition time intervals alternating with said image-acquisition time intervals;
d. an electron optical column for
   i. scanning said electron beam over a portion of the integrated circuit during said image-acquisition time intervals, and
   ii. probing said conductor by applying the electron-beam sampling pulses and the forward-scattered electrons to said conductor during said waveform-acquisition time intervals,
e. an electron detector comprising a scintillator and a photomultiplier for
   i. detecting secondary electrons emitted from the integrated circuit during said image-acquisition time intervals and producing an image signal, said scintillator exhibiting after-glow following each said image-acquisition time interval, and
   ii. detecting secondary electrons emitted from the integrated circuit during said waveform-acquisition time intervals to produce a probe signal, the probe signal having
      a. periodic first signal portions with a signal component substantially dependent upon interaction of the electron-beam sampling pulses with said conductor,
      b. periodic second signal portions with a signal component substantially dependent upon interaction of the forward-scattered electrons with said conductor,
      c. and a time-decaying distortion component due to the after-glow exhibited by the scintillator following each said image-acquisition time interval;
f. means for generating a voltage contrast image from said image signal; and
g. means for sampling the probe signal during said first signal portions and during said second signal portions, and
h. means for combining the sampled first signal portions with the complement of the sampled second signal portions to produce a measured voltage signal representing voltage of said conductor, such that said measured voltage signal is substantially free of distortion due to the after-glow exhibited by the scintillator following each said image-acquisition time interval.

* * * * *